(12) United States Patent
Ogihara et al.

(10) Patent No.: US 8,796,703 B2
(45) Date of Patent: Aug. 5, 2014

(54) DISPLAY DEVICE CAPABLE OF EMITTING LIGHT FROM OPPOSITE SIDES

(71) Applicant: Oki Data Corporation, Tokyo (JP)

(72) Inventors: Mitsuhiko Ogihara, Tokyo (JP); Kazuo Tokura, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 13/934,273

(22) Filed: Jul. 3, 2013

(65) Prior Publication Data

US 2013/0292711 A1 Nov. 7, 2013

Related U.S. Application Data

(62) Division of application No. 12/461,851, filed on Aug. 26, 2009, now abandoned.

(30) Foreign Application Priority Data

Aug. 29, 2008 (JP) .................................. 2008-222816

(51) Int. Cl.
*H01L 29/18* (2006.01)

(52) U.S. Cl.
USPC ...................... 257/88; 257/449; 257/E33.064

(58) Field of Classification Search
USPC ..................................... 257/88, 449, E33.064
See application file for complete search history.

(56) References Cited

U.S. PATENT DOCUMENTS

| | | | |
|---|---|---|---|
| 4,870,322 A | 9/1989 | Matsudaira et al. | |
| 5,376,580 A | 12/1994 | Kish et al. | |
| 2003/0025657 A1 | 2/2003 | Iwafuchi | |
| 2004/0252112 A1 | 12/2004 | Fukuda et al. | |
| 2005/0110403 A1 | 5/2005 | Han et al. | |
| 2005/0237279 A1* | 10/2005 | Chen et al. ...................... | 345/76 |
| 2006/0017379 A1 | 1/2006 | Su et al. | |
| 2006/0163605 A1* | 7/2006 | Miyahara ...................... | 257/103 |
| 2006/0255343 A1 | 11/2006 | Ogihara et al. | |

FOREIGN PATENT DOCUMENTS

| | | |
|---|---|---|
| EP | 1162670 A2 | 12/2001 |
| JP | 06-250591 A | 9/1994 |
| JP | 11-186590 A | 7/1999 |
| JP | 2003-051616 A | 2/2003 |
| JP | 2004-327431 A | 11/2004 |
| JP | 2008034473 A | 2/2008 |
| JP | 2008-159767 A | 7/2008 |
| WO | WO-2004/114272 A1 | 12/2004 |
| WO | WO-2005/060478 A2 | 7/2005 |

* cited by examiner

*Primary Examiner* — Dale E Page
(74) *Attorney, Agent, or Firm* — Rabin & Berdo, P.C.

(57) ABSTRACT

A display device includes a transparent substrate, and a plurality of single-crystal thin-film semiconductor light-emitting elements disposed on one side of the transparent substrate. Each of the single-crystal thin-film semiconductor light-emitting elements is composed of single-crystal thin-film semiconductor layers separated from a base substrate, and includes a light-emitting layer and two non-light-emitting layers disposed on both sides of the light-emitting layer.

17 Claims, 18 Drawing Sheets

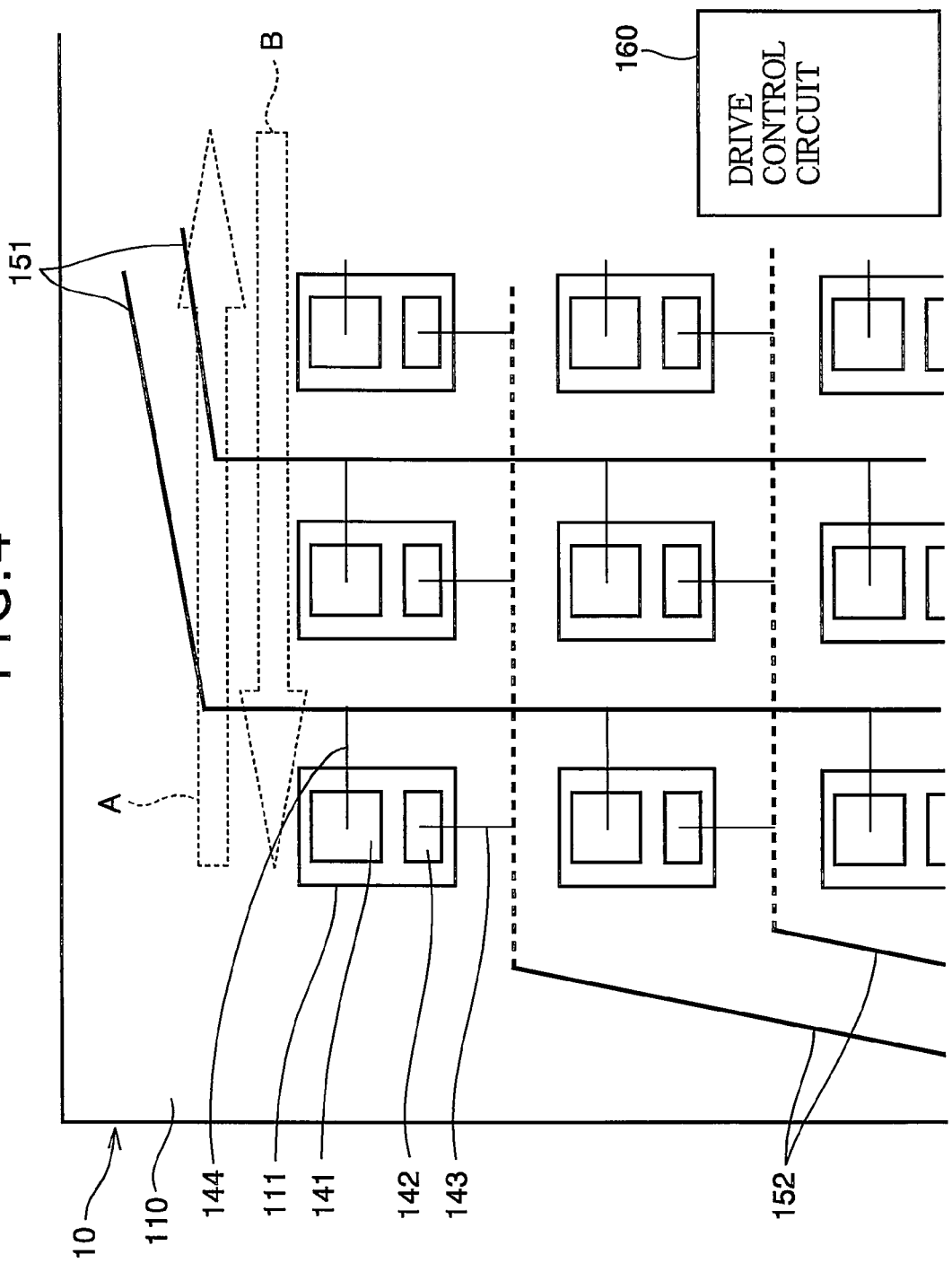

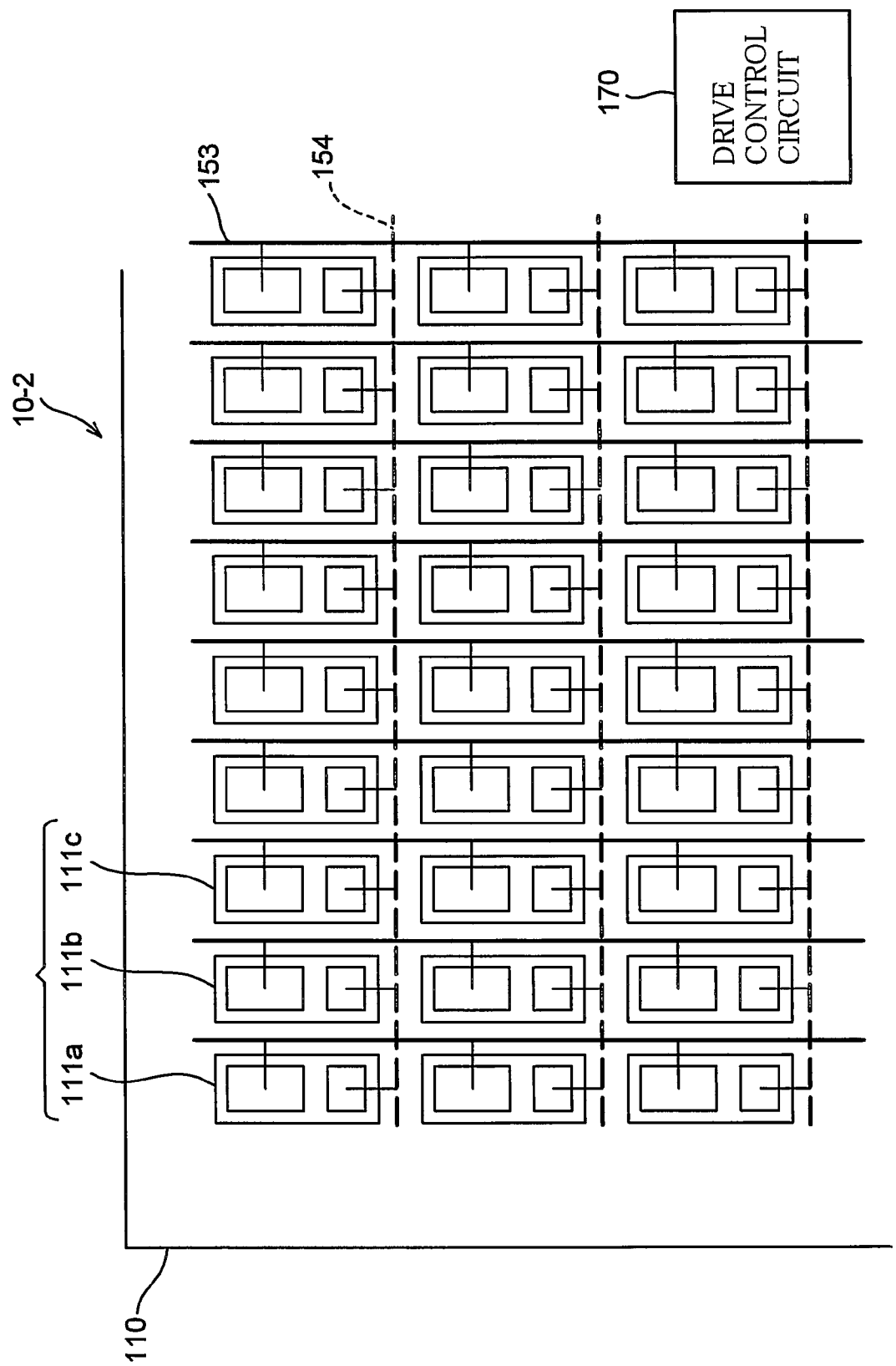

DISPLAY DEVICE CAPABLE OF EMITTING LIGHT FROM OPPOSITE SIDES

This is a Divisional of U.S. application Ser. No. 12/461,851, filed on Aug. 26, 2009, the subject matter of which is incorporated herein by reference.

BACKGROUND OF THE INVENTION

The present invention relates to a display device using a single-crystal thin-film semiconductor light-emitting element.

A single-crystal semiconductor light-emitting element has a longer lifetime and can be driven with a larger current, compared with a general light-emitting element using organic material. Therefore, the single-crystal semiconductor light-emitting element is advantageous for accomplishing a long-life and high-intensity light-emitting element. The single-crystal thin-film semiconductor light-emitting element includes a light-emitting region formed on a base substrate. Generally, in a display device, the single-crystal semiconductor light-emitting element is mounted on a transparent substrate in such a manner that the light-emitting region faces the transparent substrate. Light emitted by the light-emitting region toward the transparent substrate passes the transparent substrate, and is emitted outside. In contrast, light emitted by the light-emitting region in the opposite direction (i.e., toward the base substrate) is absorbed by the base substrate, and is not emitted outside.

For example, Japanese Laid-Open Patent Publication No. H6-250591 discloses a display device including an LED chip mounted on a transparent substrate. The LED chip includes a light-emitting region formed on a semiconductor substrate (as a base substrate). The light-emitting region side of the LED chip is bonded onto the transparent substrate using micro-bump bonding method or the like. Light emitted by the light-emitting region toward the transparent substrate passes through the transparent substrate, and is emitted outside. In contrast, light emitted by the light-emitting region in the opposite direction (i.e., toward the base substrate) is absorbed by the base substrate, and is not emitted outside.

SUMMARY OF THE INVENTION

The present invention is intended to provide a display device including at least one single-crystal thin-film semiconductor light-emitting element disposed on one side of a transparent substrate, and capable of emitting light form both sides.

According to an aspect of the present invention, there is provided a display device including a transparent substrate and a plurality of single-crystal thin-film semiconductor light-emitting elements disposed on one side of the transparent substrate. Each of the single-crystal thin-film semiconductor light-emitting elements is composed of single-crystal thin-film semiconductor layers separated from a base substrate, and includes a light-emitting layer (for example, an active layer) and two non-light-emitting layers disposed on both sides of the light-emitting layer.

With such a configuration, the base substrate (for forming the single-crystal thin-film semiconductor light-emitting element) does not exist in the display device, and therefore lights emitted by the light-emitting layer are emitted outside.

Further scope of applicability of the present invention will become apparent from the detailed description given hereinafter. However, it should be understood that the detailed description and specific embodiments, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

In the attached drawings:

FIG. 4 is a plan view showing a structure and operation of the display device according to the first embodiment of the present invention;

FIG. 6 is a plan view showing a display device according to Modification 1-1 of the first embodiment of the present invention;

DETAILED DESCRIPTION OF THE PREFERRED EMBODIMENT

Hereinafter, embodiments of the present invention will be described with reference to the attached drawings. In this regard, the drawings are schematically illustrated in order to facilitate understanding of the invention. The present invention is not limited to specific preferable examples (such as numerical values, conditions or the like) described below, but can be modified without departing from the scope of the invention. In the attached drawings, hatchings or the like are omitted as appropriate in order to avoid complexity.

First, a description will be made of a manufacturing process of single-crystal thin-film semiconductor light-emitting elements as components of a display device according to embodiments of the present invention.

<Manufacturing Process of Single-Crystal Thin-Film Semiconductor Light-Emitting Element>

Figure 1A:
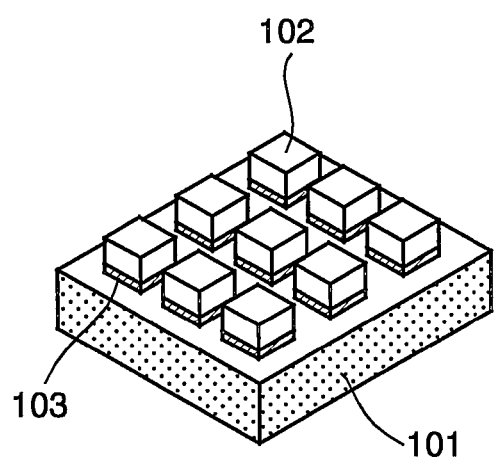
FIGS. 1A, 1B, 1C and 1D are perspective views for illustrating a manufacturing process of single-crystal thin-film semiconductor light-emitting elements of a display device according to the first embodiment of the present invention.

FIGS. 1A though 1D show manufacturing process of single-crystal thin-film semiconductor light-emitting elements 111 according to embodiments of the present invention. In this manufacturing process, first, single-crystal thin-film semiconductor layers 102 are formed on a base substrate 101 via a sacrificial layer 103 using Metal Organic Chemical Vapor Deposition (MOCVD) method or the like according to specifications of the single-crystal thin-film semiconductor light-emitting elements 111. Then, the single-crystal thin-film semiconductor layers 102 are etched (patterned) into separate sections as shown in FIG. 1A according to the specifications of the single-crystal thin-film semiconductor light-emitting elements 111 so as to expose at least the sacrificial layer 103. This separation etching can be performed using wet etching method or dry etching method. In this regard, the etching rate of the sacrificial layer 103 needs to be higher than the etching rate of the single-crystal thin-film semiconductor layers 102 and the etching rate of the base substrate 101.

Figure 1C:
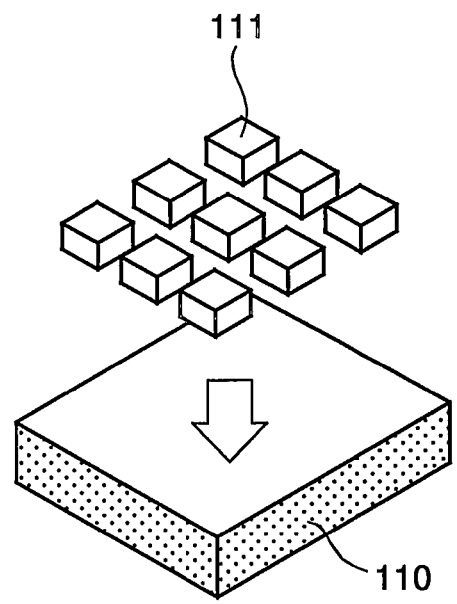
Figure 1B:
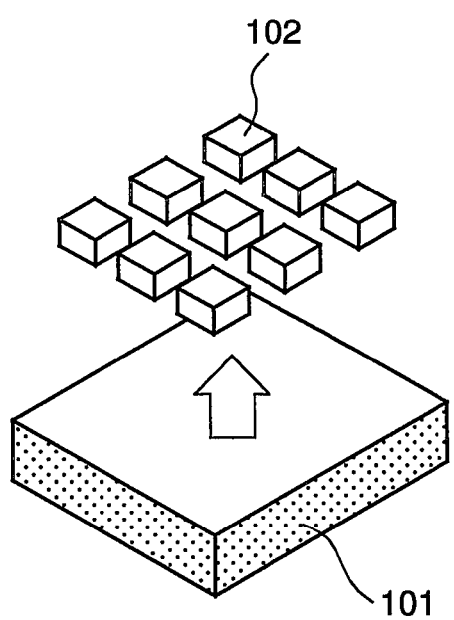

Next, the sacrificial layer 103 is selectively etched (removed) utilizing a difference between the etching rate of the sacrificial layer 103 and the etching rate of the base substrate 101 and the single-crystal thin-film semiconductor layers 102, so as to separate the single-crystal thin-film semiconductor layers 102 (as single-crystal thin-film semiconductor light-emitting elements 111) from the base substrate 101 as shown in FIG. 1B. Although not shown in FIGS. 1A through 1D, a supporting body is provided on the single-crystal thin-film semiconductor layers 102, and is used to support the single-crystal thin-film semiconductor layers 102 in the process of separating the single-crystal thin-film semiconductor layers 102 from the base substrate 101.

Figure 1D:
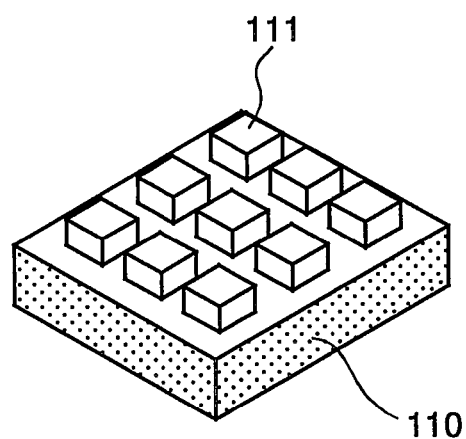

Then, the single-crystal thin-film semiconductor light-emitting elements 111 (having been separated from the base substrate 101) are pressed against a transparent substrate 110 so that the single-crystal thin-film semiconductor light-emitting elements 111 adhere to the transparent substrate 110 as shown in FIGS. 1C and 1D. The single-crystal thin-film semiconductor light-emitting elements 111 are bonded onto the transparent substrate 110 by means of intermolecular force. In this regard, no adhesive agent is provided between the transparent substrate 110 and the single-crystal thin-film semiconductor light-emitting elements 111. Thereafter, the supporting body (not shown) provided on the single-crystal thin-film semiconductor light-emitting element 111 is removed.

<Thickness of Single-Crystal Thin-Film Semiconductor Light-Emitting Element>

The thickness of the single-crystal thin-film semiconductor light-emitting element 111 is preferably in a range from 0.3 μm to 10 μm. The lower limit (0.3 μm) of the thickness is determined in order to obtain a light-emitting element with high output-efficiency using the single-crystal thin-film semiconductor layers 102. The upper limit (10 μm) of the thickness is determined in order to form interconnection wirings (for connecting electrodes on the single-crystal thin-film semiconductor light-emitting elements 111 and electrodes on the transparent substrate 110) using photolithographic technology without causing disconnection or defect, and is determined in consideration of safety coefficient.

<Transparent Substrate>

The transparent substrate 110 can be composed of, for example, glass, plastic, quarts, sapphire, oxide (such as ZnO) or nitride (such as GaN, AlN or SiN). The transparent substrate 110 has high optical transmittance of light emitted by single-crystal thin-film semiconductor light-emitting element 111 formed on the transparent substrate 110. Although the optical transmittance is determined based on application, it is preferable that the optical transmittance of the transparent substrate 110 is higher than or equal to 50% to the light emitted by the single-crystal thin-film semiconductor light-emitting element 111.

<Bonding Structure>

As describe above, the single-crystal thin-film semiconductor light-emitting elements 111 are preferably directly bonded onto the transparent substrate 110 by means of intermolecular force without using adhesive agent. However, it is also possible to provide a transparent dielectric layer on the transparent substrate 110, and to directly bond the single-crystal thin-film semiconductor light-emitting elements 111 onto the dielectric layer. Further, it is also possible to provide a transparent adhesive material layer on the transparent substrate 110, and to cause the single-crystal thin-film semiconductor light emitting element 111 to adhere to the transparent adhesive material layer.

<Device Structure>

Next, descriptions will be made of a structure and light-emitting function of a display device including the single-crystal thin-film semiconductor light-emitting element 111 on the transparent substrate 110 according to the first embodiment of the present invention.

Figure 2:
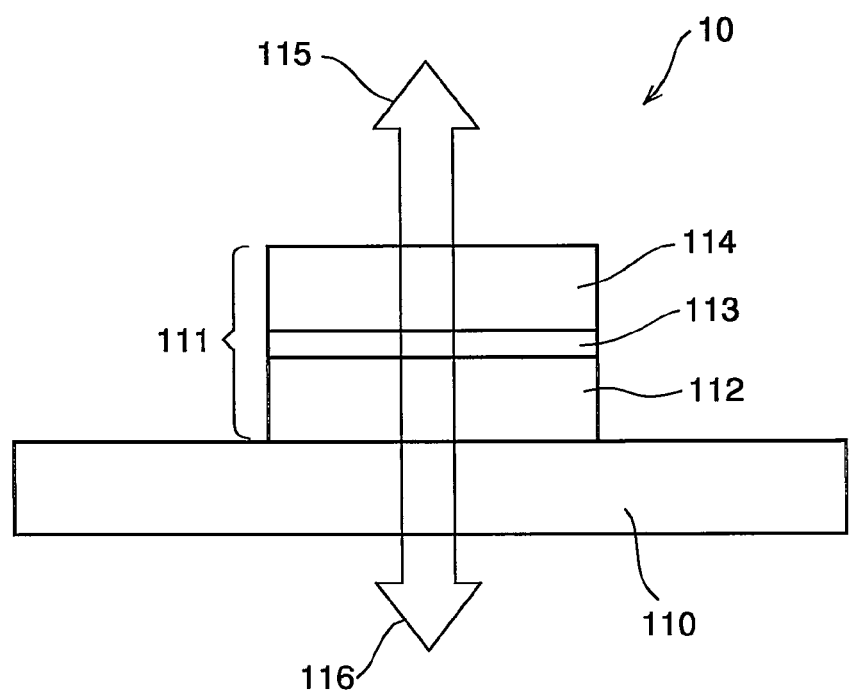
FIG. 2 is a sectional view showing a display device including the single-crystal thin-film semiconductor light-emitting element according to the first embodiment of the present invention.

FIG. 2 is a sectional view showing a display device 10 including the single-crystal thin-film semiconductor light-emitting element 111 disposed on the transparent substrate 110 according to the first embodiment of the present invention. As shown in FIG. 2, the display device 10 of the first embodiment is configured so that the single-crystal thin-film semiconductor light-emitting element 111 is directly bonded onto the transparent substrate 110, and light is emitted from both sides of the single-crystal thin-film semiconductor light-emitting element 111. The single-crystal thin-film semiconductor light-emitting element 111 includes a light-emitting layer (i.e., an active layer) 113 and two non-light-emitting layers 112 and 114 disposed on both sides of the light-emitting layer 113. Each of the non-light-emitting layers 112 and 114 has a higher energy band gap than the light-emitting layer 113, so as to reduce absorption of light (emitted by the light-emitting layer 113) by the non-light-emitting layers 112 and 114. With such a structure, lights 115 and 116 emitted by the light-emitting layer 113 are emitted from both sides of the single-crystal thin-film semiconductor light-emitting element 111. Therefore, it becomes possible to accomplish the display device 10 that independently displays images on both sides of the transparent substrate 110 using the lights 115 and 116 emitted by the single-crystal thin-film semiconductor light-emitting element 111 disposed on one side of the transparent substrate 110. In this regard, it is more preferable that the thickness of the single-crystal thin-film semiconductor light-emitting element 111 is in a range from 2 µm to 3 µm.

In the first embodiment, the single-crystal thin-film semiconductor light-emitting element 111 has a double-heterojunction structure in which the light-emitting layer (i.e., the active layer) 113 is sandwiched between the non-light-emitting layers 112 and 114 each of which has a higher energy band gap than the light-emitting layer 113. However, the single-crystal thin-film semiconductor light-emitting element 111 can have a single-heterojunction structure in which the non-light-emitting layer having a higher energy band gap is disposed on one side of the light-emitting layer. Furthermore, the single-crystal thin-film semiconductor light-emitting element 111 can have a homostructure in which the non-light-emitting layer is disposed on one side of the light-emitting element, and the non-light-emitting layer has the same composition (i.e., the same energy band gap) as the light-emitting layer but has different conductivity type. If the homostructure is employed, it is also possible to provide non-light-emitting layers (as contact layers or intermolecular-force bonding layers) having lower energy band gap than the active layer (the light-emitting layer) on both sides of the active layer constituting a homojunction structure.

<Structure, Operation and Effect of Display Device>

Next, a description will be made of a structure, operation and effect of the display device 10 according to the first embodiment including the single-crystal thin-film semiconductor light-emitting elements 111.

In the display device 10 according to the first embodiment, the single-crystal thin-film semiconductor light-emitting elements 111 are bonded onto one side of the transparent substrate 110 and are arranged two-dimensionally on one side of the transparent substrate 110. Light emission data signals are sent to the respective single-crystal thin-film semiconductor light-emitting elements 111 (i.e., pixels) which are two-dimensionally arranged. A direction (i.e., a scanning direction) along which the light emission data signals are sent to the single-crystal thin-film semiconductor light-emitting elements 111 is reversed at constant time intervals, and therefore the display device 10 is able to display images equally on both sides of the transparent substrate 110.

Figure 3A:
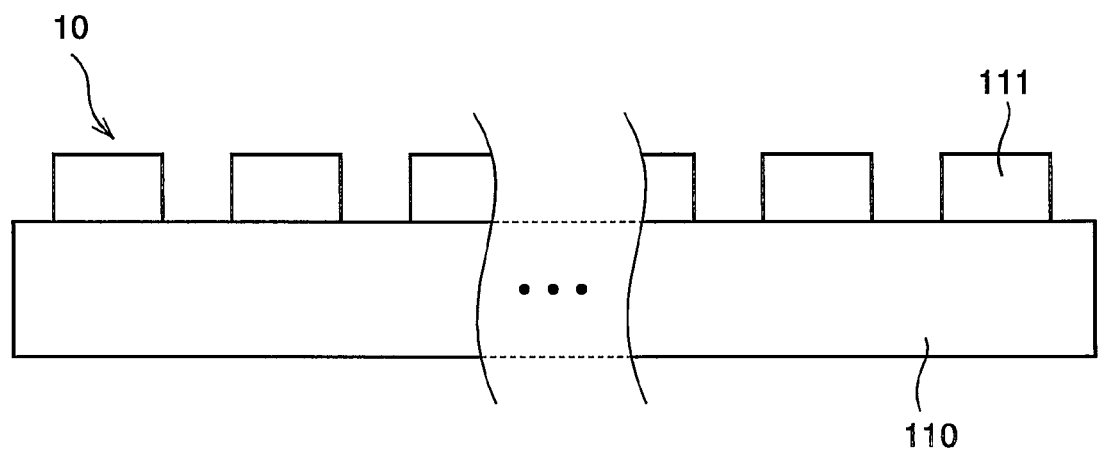
FIGS. 3A and 3B are respectively a sectional view and a plan view showing the display device according to the first embodiment of the present invention.
Figure 3B:
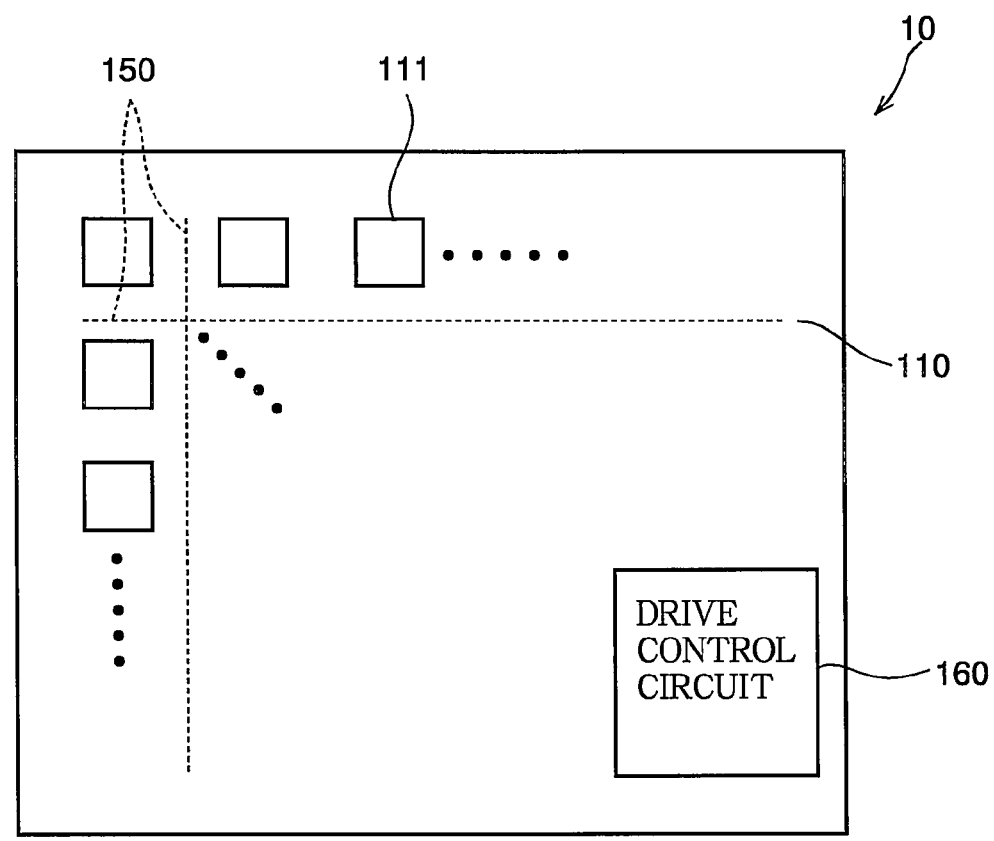

FIGS. 3A and 3B are a sectional view and a plan view schematically showing a structure of the display device 10 according to the first embodiment. As described above, the single-crystal thin-film semiconductor light-emitting elements 111 are arranged two-dimensionally on the transparent substrate 110. The single-crystal thin-film semiconductor light-emitting elements 111 are connected to wirings 150 formed on the transparent substrate 110 and extending in a vertical direction (i.e., y-direction) and in a horizontal direction (i.e., x-direction). The wirings 150 are connected to a drive control circuit 160 provided on the transparent substrate 110. In this regard, the drive control circuit 160 is not necessarily provided on the transparent substrate 110, but can be provided on the outside of the transparent substrate 110.

FIG. 4 is a plan view for illustrating the structure and operation of the display device 10 according to the first embodiment. The single-crystal thin-film semiconductor light-emitting elements 111 respectively have light-emitting regions 141 and electrode regions 142. The light-emitting regions 141 and electrode regions 142 are respectively connected via interconnection wirings 144 and 143 to y-direction wirings 151 and x-direction wirings 152 formed on the transparent substrate 110. In a particular example shown in FIG. 4, the interconnection wirings 144 extending from the light-emitting regions 141 also function as electrode contacts on the light-emitting regions 141.

The display device 10 according to the first embodiment has a drive control circuit 160. The drive control circuit 160 turns on connections between the single-crystal thin-film semiconductor light-emitting elements 111 (which are supposed to emit lights) and the x-direction wirings 152, and sends the light emission data signals to these single-crystal thin-film semiconductor light emitting element 111 via the y-direction wirings 151 while scanning in a direction A so as to display an image for a constant time interval. Then, the drive control circuit 160 causes addresses of the single-crystal thin-film semiconductor light-emitting elements 111 (which are supposed to emit lights) to be left-right reversed, turns on the connections between the single-crystal thin-film semiconductor light-emitting elements 111 (which are supposed to emit lights) and the x-direction wirings 152, and sends the light emission data signals to the single-crystal thin-film semiconductor light emitting element 111 via the y-direction wirings 151 while scanning in a direction B (opposite to the direction A) so as to display an image for a constant time interval.

In this regard, it is also possible to employ an arrangement enabling active matrix driving. In particular, for example, capacitance elements, transistors, and wirings (for operating the capacitance elements and transistors) can be provided for the respective single-crystal thin-film semiconductor light-emitting elements 111. Further, the drive control circuit 160 can drive the capacitance elements and the transistors of the single-crystal thin-film semiconductor light-emitting elements 111 (which are supposed to emit lights) while selecting the x-direction wirings 152 and the y-direction wirings 151 to cause these single-crystal thin-film semiconductor light-emitting elements 111 to emit lights at the same time.

With such a configuration, it becomes possible to accomplish the display device 10 having the drive control circuit 160 capable of displaying the same images (i.e., patterns of light emissions) alternately on both sides of the transparent substrate 110 respectively for constant time periods, and switching the image-displaying sides at constant time intervals.

More specifically, the display device 10 with the two-dimensionally arranged single-crystal thin-film semiconductor light-emitting elements 111 displays image as follows: First, the connections between the single-crystal thin-film semiconductor light-emitting elements 111 (which are supposed to emit lights) and the x-direction wirings 152 are turned on, and the light emission data signals are sent to these single-crystal thin-film semiconductor light-emitting elements 111 via the y-direction wirings 151 while scanning in the direction A. With this, the display device 10 displays a predetermined image as seen from a surface-side of the transparent substrate 110 (i.e., a bonding side onto which the single-crystal thin-film semiconductor light-emitting elements 111 are bonded). In this state, a left-right reversed image can be observed from a backside of the transparent substrate 110 (i.e., opposite to the above describe bonding side of the transparent substrate 110). After the image is displayed on the surface-side, the addresses of the single-crystal thin-film semiconductor light-emitting elements 111 which are supposed to emit lights are left-right reversed, the connections between these single-crystal thin-film semiconductor light-emitting elements 111 and the x-direction wirings 152 are turned on, and the light emission data signals are sent to these single-crystal thin-film semiconductor light-emitting elements 111 via the y-direction wirings 151 while scanning in the direction B opposite to the direction A. By switching the image-displaying sides at constant time intervals, the same images can be displayed for respectively constant time periods alternately on both sides of the display device 110.

In this regard, it is also possible to select the x-direction wirings 152 and the y-direction wirings 154 so as to cause the two-dimensionally arranged single-crystal thin-film semiconductor light-emitting elements 111 (which are supposed to emit lights) to emit lights at the same time. Also in this case, the same images can be displayed on both sides of the transparent substrate 110 for predetermine time periods.

As described above, the display device 10 of the first embodiment includes single-crystal thin-film semiconductor light-emitting elements 111 arranged two-dimensionally on the transparent substrate 110, and is configured to emit lights from both sides of the transparent substrate 110. Further, the display device 10 includes the drive control circuit 160 that reverses the image-displaying sides of the transparent substrate 110 at constant intervals. Therefore, it becomes possible to accomplish the display device 10 capable of displaying the same images alternately on both sides of the transparent substrate 110.

In this first embodiment, the left-right reversed patterns of light emissions of the single-crystal thin-film semiconductor light-emitting elements 111 are alternately displayed on both sides of the transparent substrate 110 for constant time periods. However, it is also possible to display different images (i.e., images which are not left-right reversed with respect to each other) on both sides of the transparent substrate 110 at constant periods. Further, the single-crystal thin-film semiconductor light-emitting elements 111 are not necessarily arranged regularly, for example, in a matrix of with rows (n) and columns (m).

Examples and Modifications of First Embodiment

Next, examples and modifications of the first embodiment will be described with reference to FIGS. 5A to 8.

Figure 5A:
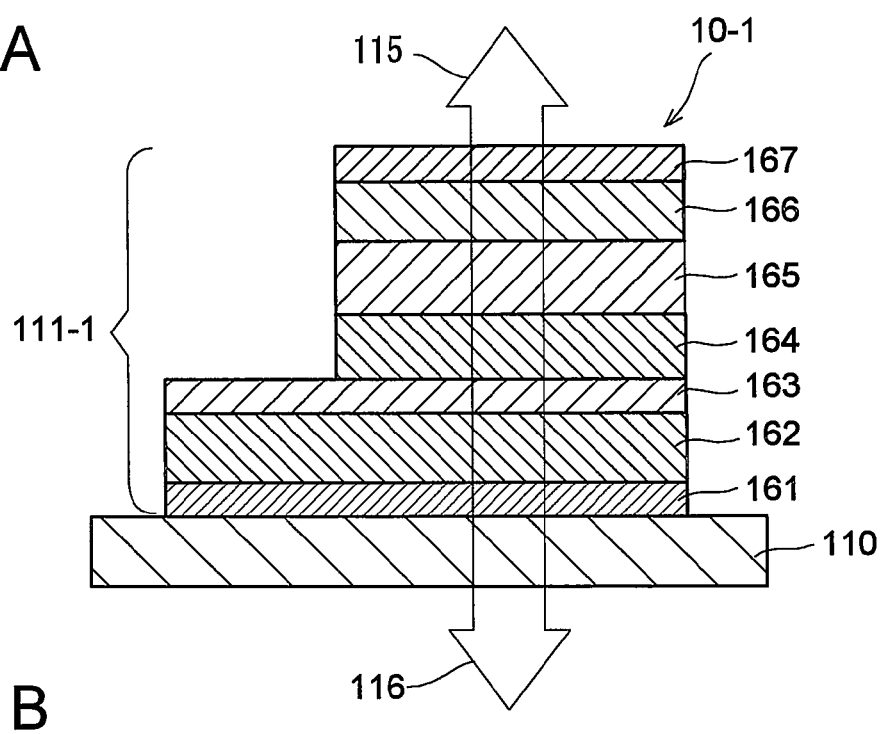
FIG. 5A is a sectional view showing a display device according to Example 1-1 of the first embodiment of the present invention.
Figure 5B:
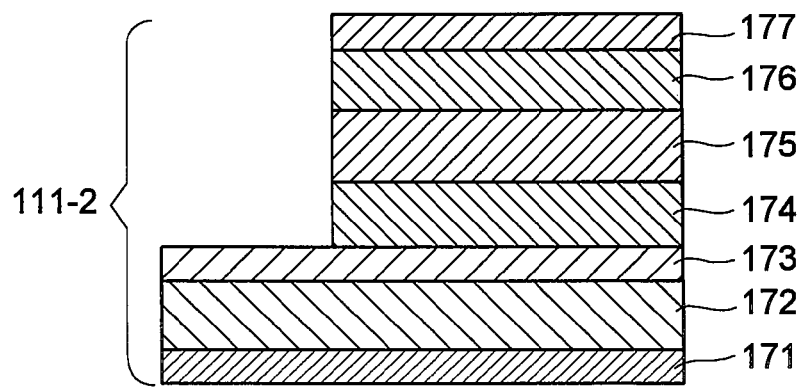
FIG. 5B is a sectional view showing a display device according to Example 1-2 of the first embodiment of the present invention.
Figure 5C:
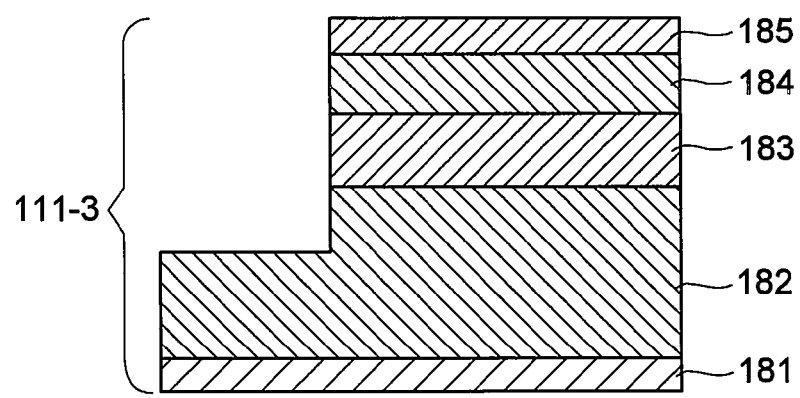
FIG. 5C is a sectional view showing a display device according to Example 1-3 of the first embodiment of the present invention.

FIGS. 5A through 5C are sectional views showing structures of single-crystal thin-film semiconductor light-emitting elements 111 formed of typical compound semiconductor materials according to examples of the first embodiment. In this regard, FIGS. 5A through 5C schematically show structures of the single-crystal thin-film semiconductor light-emitting elements 11, and are not intended to show layer-thicknesses and sizes of the single-crystal thin-film semiconductor light-emitting elements 111. The display devices of the examples of the first embodiment are not limited to those shown in FIGS. 5A through 5C, but various modifications can be made.

Example 1-1

FIG. 5A is a sectional view showing a display device 10-1 of Example 1-1 of the first embodiment including an AlGaAs-based single-crystal thin-film semiconductor light-emitting element 111-1 as a light source.

The single-crystal thin-film semiconductor light-emitting element 111-1 includes the AlGaAs-based single-crystal thin-film semiconductor light-emitting element 111-1 bonded onto the transparent substrate 110. The AlGaAs-based single-crystal thin-film semiconductor light-emitting element 111-1 includes a GaAs layer 161, an $Al_tGa_{1-t}As$ layer 162, a GaAs layer 163, an $Al_xGa_{1-x}As$ 164, an $Al_yGa_{1-y}As$ layer (i.e., an active layer) 165, an $Al_zGa_{1-z}As$ layer 166 and a GaAs layer 167 laminated on the transparent substrate 110 in this order from the bottom (i.e., from the transparent substrate 110 side). The lights 115 and 116 emitted by the $Al_yGa_{1-y}As$ layer (i.e., the active layer) 165 are emitted outside from both sides of the transparent substrate 110. It is preferable that the compositional parameters (x, y, z and t) of the respective layers (i.e., Al content) satisfy the relationship: y<x, z, t.

Example 1-2

FIG. 5B is a sectional view showing a display device of Example 1-2 of the first embodiment including an AlGaInP-based single-crystal thin-film semiconductor light-emitting element 111-2 as a light source.

The single-crystal thin-film semiconductor light-emitting element 111-2 includes a GaAs layer 171, an $(Al_tGa_{1-t})_{s1}In_{1-s1}P$ layer 172, a GaAs layer 173, an $(Al_xGa_{1-x})_{s2}In_{1-s2}P$ layer 174, an $(Al_yGa_{1-y})_{s2}In_{1-s2}P$ layer (i.e., an active layer) 175, an $(Al_zGa_{1-z})_{s2}In_{1-s2}P$ layer 176 and a GaAs layer 177 laminated on the transparent substrate 110 (FIG. 5A) in this order from the bottom (i.e., from the transparent substrate 110 side). The compositional parameters (x, y, z, s1 and s2) of the respective semiconductor layers preferably satisfy the relationships $0.49 \leq s1 = s2 \leq 0.51$, and y<x, z. The active layer 175 can have a laminated structure of $(Al_qGa_{1-q})_{s2}In_{1-s2}P/(Al_rGa_{1-r})_{s2}In_{1-s2}P$ (i.e., in which $(Al_rGa_{1-r})_{s2}In_{1-s2}P$ is laminated on $(Al_qGa_{1-q})_{s2}In_{1-s2}P$). The thickness of the active layer 175 can be set so as to obtain a quantum-well structure. The compositional parameters (q, r and s2) of the active layer 175 can be determined according to wavelength, for example, q=1, r=0 and s2=0.5.

Example 1-3

FIG. 6C is a sectional view showing a display device of Example 1-3 of the first embodiment including a GaN-based single-crystal thin-film semiconductor light-emitting element 111-3 as a light source.

The single-crystal thin-film semiconductor light-emitting element 111-3 includes an AlN layer 181, a GaN layer 182, an active layer 183 with a laminated structure of $In_xGa_{1-x}N/GaN$ (i.e., in which a GaN layer is laminated on an $In_xGa_{1-x}N/GaN$ layer), an $Al_yGa_{1-y}N$ layer 184 and a GaN layer 185 laminated on the transparent substrate 110 (FIG. 5A) in this order from the bottom (i.e., the transparent substrate 110 side). In this case, the GaN layer 182, the active layer 183 (i.e., the $In_xGa_{1-x}N$ layer and the GaN layer) and the $Al_yGa_{1-y}N$ layer 184 can be replaced with layers including an $In_xGa_{1-x}N$ layer (x≥0) as an active layer sandwiched between an $n-Al_zGa_{1-z}N$ layer (z≥0) and a $p-Al_yGa_{1-y}N$ layer (y≥0).

Modification 1-1

In the first embodiment and examples thereof, the single-crystal thin-film semiconductor light-emitting elements of the display device 10 are not necessarily composed of the same material. For example, as shown in FIG. 6, the display device can include the single-crystal thin-film semiconductor light-emitting elements 111a 111b, 111c which are composed of materials different from each other. In Modification 1-1, the display device 10-2 includes the single-crystal thin-film semiconductor light-emitting elements 111a, 111b and 111c respectively configured as red, green and blue single-crystal thin-film semiconductor light-emitting elements that emit red, green and blue lights. With such a configuration, the display device 10-2 capable of displaying color image can be accomplished. In such a case, the display device 10-2 includes the single-crystal thin-film semiconductor light-emitting elements 111a, 111b and 111c, the transparent substrate 110, the y-direction wirings 153, the x-direction wirings 154 and the drive control circuit 170 as described above.

Modification 1-2

Figure 7:
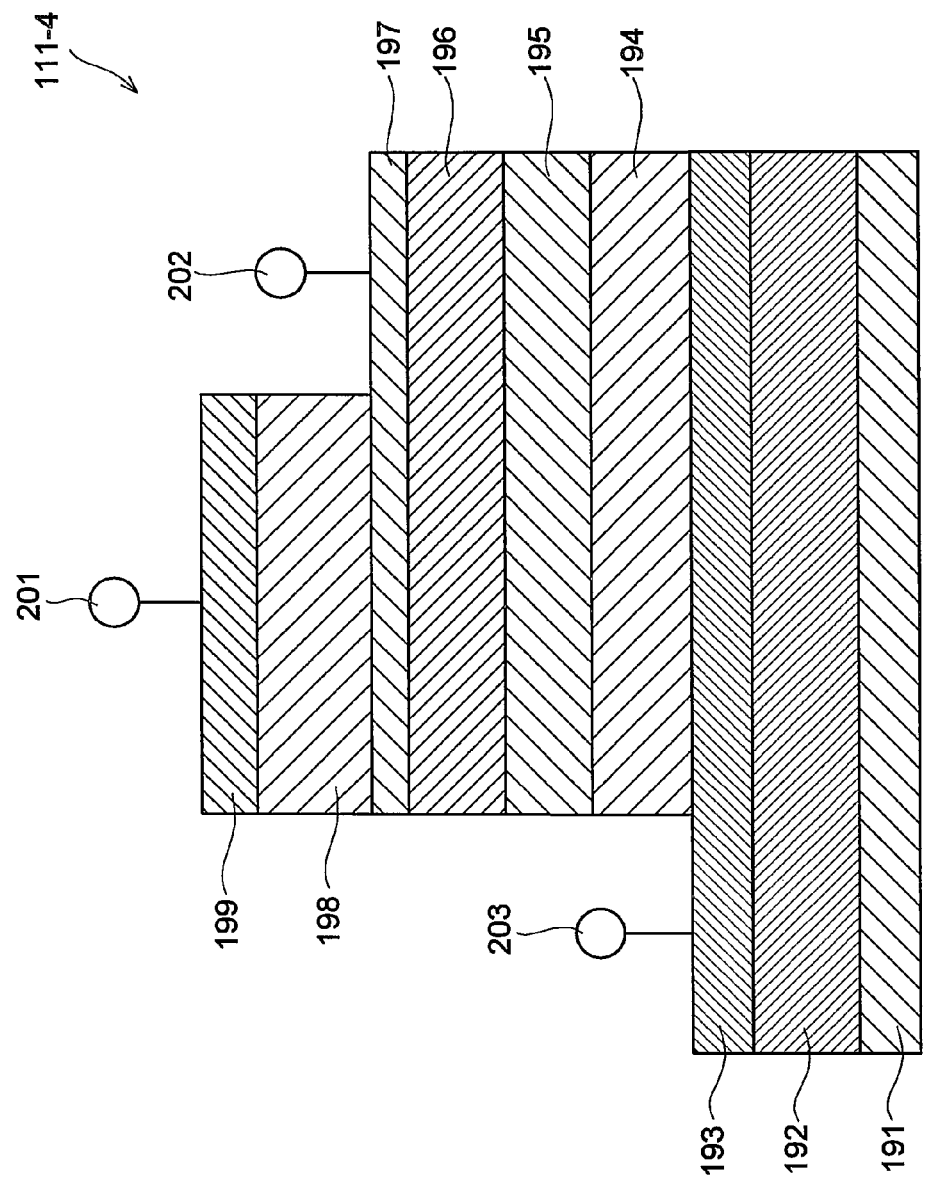
FIG. 7 is a plan view showing a single-crystal thin-film semiconductor light-emitting element of three-terminal type according to Modification 1-2 of the first embodiment of the present invention.

In the examples and modification of the first embodiment, the two-terminal type light-emitting elements have been described. However, the single-crystal thin-film semiconductor light-emitting element of the first embodiment can be, for example, of three-terminal type as shown in FIG. 7. The three-terminal type single-crystal thin-film semiconductor light-emitting element 111-4 of Modification 1-2 is an AlGaAs-based single-crystal thin-film semiconductor light-emitting element. More specifically, the single-crystal thin-film semiconductor light-emitting element 111-4 includes an n-GaAs layer 191, an n-Al$_r$Ga$_{1-r}$As layer 192, an n-GaAs layer (i.e., a cathode contact layer) 193, an n-Al$_x$Ga$_{1-x}$As layer 194, an n-Al$_y$Ga$_{1-y}$As layer (i.e., an active layer) 195, a p-Al$_z$Ga$_{1-z}$As layer 196, an n-Al$_r$Ga$_{1-r}$As layer (i.e., a gate contact layer) 197, a p-Al$_s$Ga$_{1-s}$Al layer 198, a p-GaAs layer (i.e., an anode contact layer) 199, an anode electrode 201, a gate electrode 202 and a cathode electrode 203 laminated on the transparent substrate 110 (FIG. 5A) in this order from the bottom (i.e., from the not shown transparent substrate 110 side).

Second Embodiment

Figure 8:
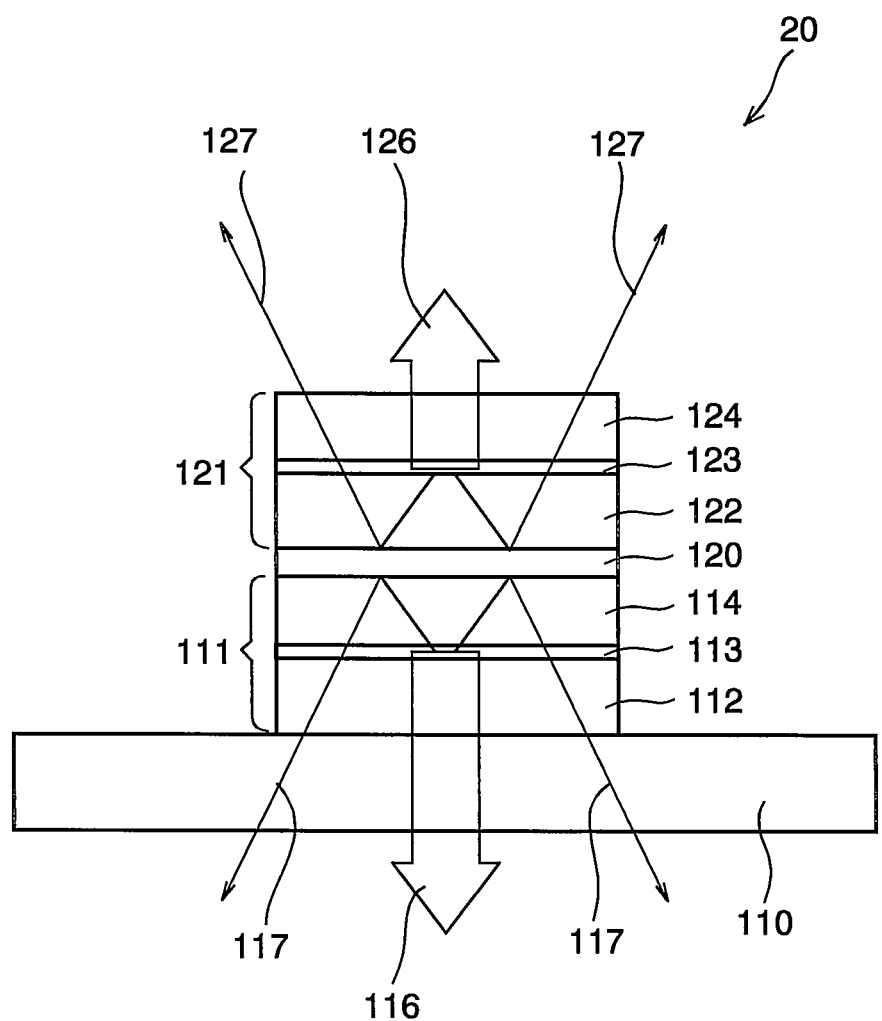
FIG. 8 is a sectional view showing a display device including single-crystal thin-film semiconductor light-emitting elements according to the second embodiment of the present invention.

FIG. 8 is a sectional view showing a display device 20 according to the second embodiment of the present invention. As shown in FIG. 8, the display device 20 includes another single-crystal thin-film semiconductor light-emitting element 121 laminated on the single-crystal thin-film semiconductor light-emitting element 111 (having been described in the first embodiment) via a non-light-transmitting layer 120. The upper single-crystal thin-film semiconductor light-emitting element 121 includes a light-emitting layer (an active layer) 123 and non-light-emitting layers 122 and 124 disposed on both sides of the light-emitting layer 123. It is necessary that each of the non-light-emitting layers 122 and 124 has a higher energy band gap than the light-emitting layer 123, as in the first embodiment. In the second embodiment, a total thickness of the single-crystal thin-film semiconductor light-emitting elements 111 and 121 and the non-light-transmitting layer 120 is preferably in a range from 4 μm to 7 μm. Further, in the second embodiment, the non-light-transmitting layer 120 reflects or absorbs the lights emitted by the light-emitting layers (i.e., the active layers) 113 and 123 toward the non-light-transmitting layer 120. With such a structure, the lights 116, 117, 126 and 127 emitted by the light-emitting layers (i.e., the active layers) 113 and 123 can be emitted outside from both sides of the non-light-transmitting layer 120 (i.e., the respective single-crystal thin-film semiconductor light-emitting elements 111 and 121 sides).

Therefore, the display device 20 is able to independently display images on both sides of the transparent substrate 110.

Furthermore, the display device 20 includes a drive control circuit 180 (see FIG. 9) that independently controls light emissions of the single-crystal thin-film semiconductor light-emitting elements 111 and 121 on both side of the non-light-transmitting layer 120.

Examples of Second Embodiment

Next, examples of the second embodiment will be described with reference to FIGS. 9 to 13.

Example 2-1

Figure 9:
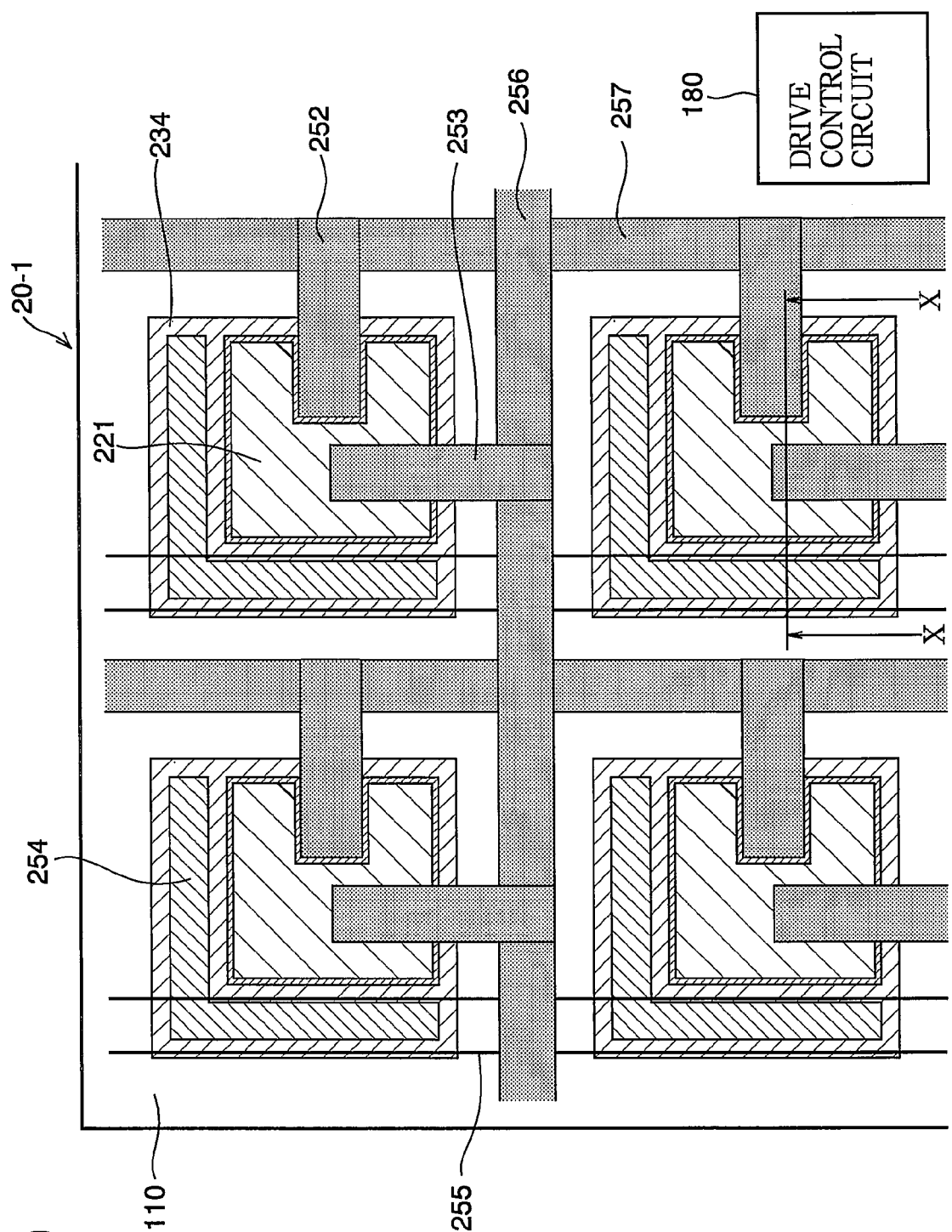
FIG. 9 is a plan view showing a structure and operation of the display device according to Example 2-1 of the second embodiment of the present invention.
Figure 10:
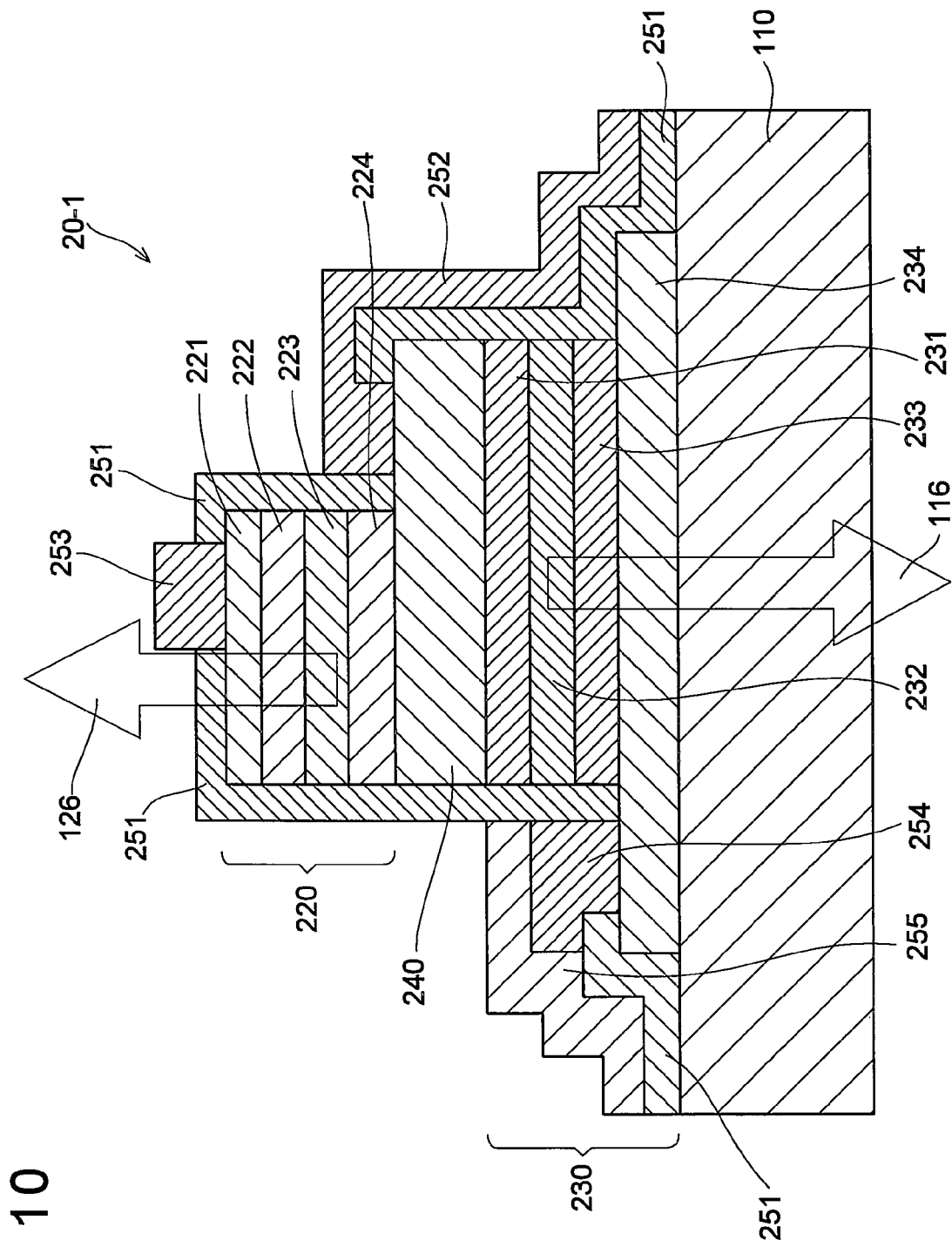
FIG. 10 is a sectional view showing the display device according to Example 2-1 of the second embodiment of the present invention.

A display device 20-1 of Example 2-1 includes AlGaAs-based single-crystal thin-film semiconductor light-emitting elements. FIG. 9 is a plan view showing the display device 20-1 according to Example 2-1 of the second embodiment, including a plurality of AlGaAs-based single-crystal thin-film semiconductor light-emitting elements. FIG. 10 is a sectional view taken along line X-X in FIG. 9.

As shown in FIG. 9, the display device 20-1 includes a plurality of laminated pairs of AlGaAs-based single-crystal thin-film semiconductor light-emitting elements 220 and 230 (see FIG. 10) arranged two-dimensionally on the transparent substrate 110. The AlGaAs-based single-crystal thin-film semiconductor light-emitting elements 220 and 230 have common electrodes 252 connected to common wirings 257, upper n-side electrodes 253 and lower n-side electrodes 254 respectively connected to upper n-side control wirings 256 and lower n-side control wirings 255. The drive control circuit 180 independently controls the upper and lower single-crystal thin-film semiconductor light-emitting elements 220 and 230.

As shown in FIG. 10, the lower single-crystal thin-film semiconductor light-emitting element 230 includes an n-side conductive layer 234 (n-GaAs/n-Al$_r$Ga$_{1-r}$As/n-GaAs), an n-Al$_{z2}$Ga$_{1-z2}$As layer 233, an n-Al$_{y2}$Ga$_{1-y2}$As layer (i.e., an active layer) 232 and a p-Al$_{x2}$Ga$_{1-x2}$As layer 231 laminated on the transparent substrate 110 in this order from the bottom (i.e., from the transparent substrate 110 side). A p-GaAs layer (i.e., a light absorbing layer) 240 as a non-light-transmission layer is formed on the single-crystal thin-film semiconductor light-emitting element 230. The upper single-crystal thin-film semiconductor light-emitting element 220 is formed on the p-GaAs layer 240. The upper single-crystal thin-film semiconductor light-emitting element 220 includes a p-Al$_{z1}$Ga$_{1-z1}$As layer 224, an n-Al$_{y1}$Ga$_{1-y1}$As layer (i.e., an active layer) 223, an n-Al$_{x1}$Ga$_{1-x1}$As layer 222 and n-GaAs layer 221 laminated in this order from the p-GaAs layer 240 side. The common electrodes 252, the upper n-side electrodes 253, the lower n-side electrodes 254 and the lower n-side control wirings 255 or the like are provided on the single-crystal thin-film semiconductor light emitting elements 220 and 230 via an insulation film 251 (as an interlayer insulation film).

In this Example 2-1, compositional parameters (x1, x2, y1, y2, z1 and z2) of Al satisfy the relationships: y1<x1, z1 and y2<x2, z2. When y1=y2 is satisfied, the n-Al$_{y1}$Ga$_{1-y1}$As layer (i.e., the upper active layer) 223 and the n-Al$_{y2}$Ga$_{1-y2}$As layer (i.e., the lower active layer) 232 on both sides of the p-GaAs layer 240 (i.e., the light absorbing layer) emit lights having the same wavelengths. The thickness of the p-GaAs layer (the light absorbing layer) 240 is, for example, in a range from 0.5 μm to 1 μm. With such a thickness, the p-GaAs layer 240 absorbs the lights from the upper and lower active layers 223 and 232, and functions as non-light-transmitting layer. It is also possible to replace the p-GaAs layer 240 with a layer of different conductivity type, for example, a laminated structure including for example, an n-GaAs layer (on the p-Al$_{z1}$Ga$_{1-z1}$As layer 224 side), a high resistance GaAs layer and a p-GaAs layer (on the p-Al$_{x2}$Ga$_{1-x2}$As layer 231 side). In such a case, the upper single-crystal thin-film semiconductor light-emitting element 220 can be configured to include an n-AlGaAs layer 224, a p-AlGaAs layer 223, a p-AlGaAs layer 222 and a p-GaAs layer 221. The upper single-crystal thin-film semiconductor light-emitting element 220 can have n-side and p-side electrodes which are independent from those of the lower single-crystal thin-film semiconductor light-emitting elements 230, and other modifications can be made.

The lights emitted by the light-emitting layers 223 and 232 of the respective single-crystal thin-film semiconductor light-emitting elements 220 and 230 and proceeding toward the p-GaAs layer 240 are absorbed by the p-GaAs layer 240 (the light absorbing layer) as the non-light-transmitting layer, and the lights proceeding in directions away from the p-GaAs layer 240 are emitted outside as emitted light 116 and 126.

Example 2-2

Figure 11:
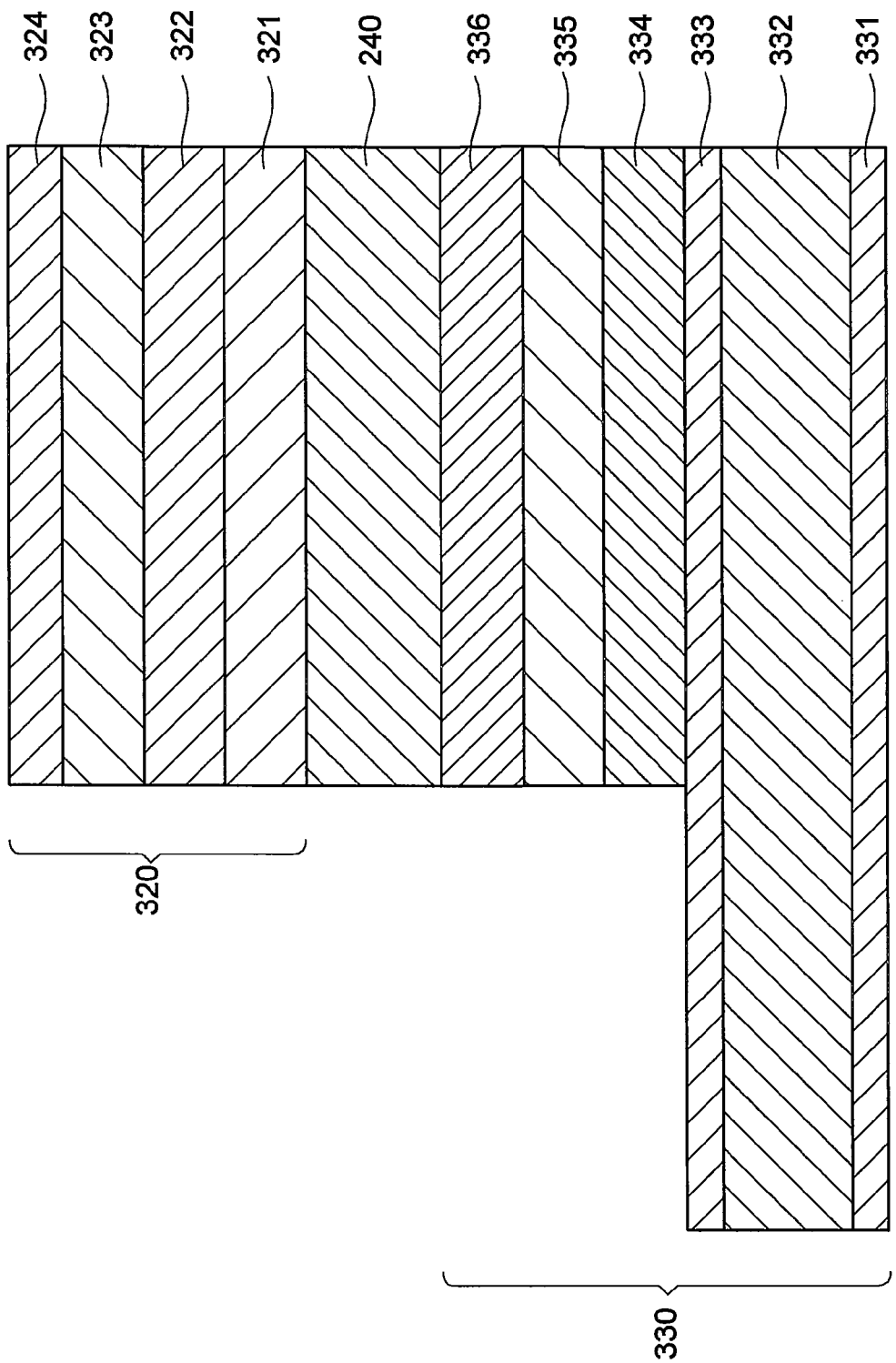
FIG. 11 is a sectional view showing AlGaInP-based single-crystal thin-film semiconductor light-emitting elements according to Example 2-2 of the second embodiment of the present invention.

A display device of Example 2-2 of the second embodiment includes AlGaInP-based single-crystal thin-film semiconductor light-emitting elements. FIG. 11 is a sectional view showing AlGaInP-based single-crystal thin-film semiconductor light-emitting elements 320 and 330 of the display device according to Example 2-2 of the second embodiment.

The upper single-crystal thin-film semiconductor light-emitting element 320 is formed on a p-GaAs layer (i.e., a light absorbing layer) 240 as a non-light-transmitting layer. The upper single-crystal thin-film semiconductor light-emitting element 320 includes a p-(Al$_{x1}$Ga$_{1-x1}$)$_{y1}$In$_{1-y1}$P layer 321, an n-(Al$_{x2}$Ga$_{1-x2}$)$_{y1}$In$_{1-y1}$P layer (i.e., an active layer) 322, an n-(Al$_{x3}$Ga$_{1-x3}$)$_{y1}$In$_{1-y1}$P layer 323 and an n-GaAs layer 324 laminated in this order from the bottom (i.e., from the p-GaAs layer 240 side). In this regard, compositional parameters (x1, x2, x3 and y1) of the respective layers satisfy the relationships: 0.49≤y1≤0.51, x2<x1, x3. The lower single-crystal thin-film semiconductor light-emitting element 330 below the p-GaAs layer 240 includes a p-(Al$_{z3}$Ga$_{1-z3}$)$_{y1}$In$_{1-y1}$P layer 336, an n-(Al$_{z2}$Ga$_{1-z2}$)$_{y1}$In$_{1-y1}$P layer (i.e., an active layer) 335, an n-(Al$_{z1}$Ga$_{1-z1}$)$_{y1}$In$_{1-y1}$P layer 334, an n-GaAs layer 333, an n-(Al$_{s1}$Ga$_{1-s1}$)$_{y1}$In$_{1-y1}$P layer 332 and an n-GaAs layer 331 in this order from the top (i.e., from the p-GaAs layer 240 side). In this case, compositional parameters (y1, z1, z2, z3) of the respective layers satisfy the relationships: 0.49≤y1≤0.51, z2<z1, z3. Further, the n-(Al$_{z2}$Ga$_{1-z2}$)$_{y1}$In$_{1-y1}$P layer 335 (i.e., the active layer) can be replaced with a laminated structure such as (Al$_{t1}$Ga$_{1-t1}$)$_{y1}$In$_{1-y1}$P/(Al$_{t2}$Ga$_{1-t2}$)$_{y1}$In$_{1-y1}$P and having, for example, a non-dope type quantum-well structure.

Example 2-3

Figure 12:
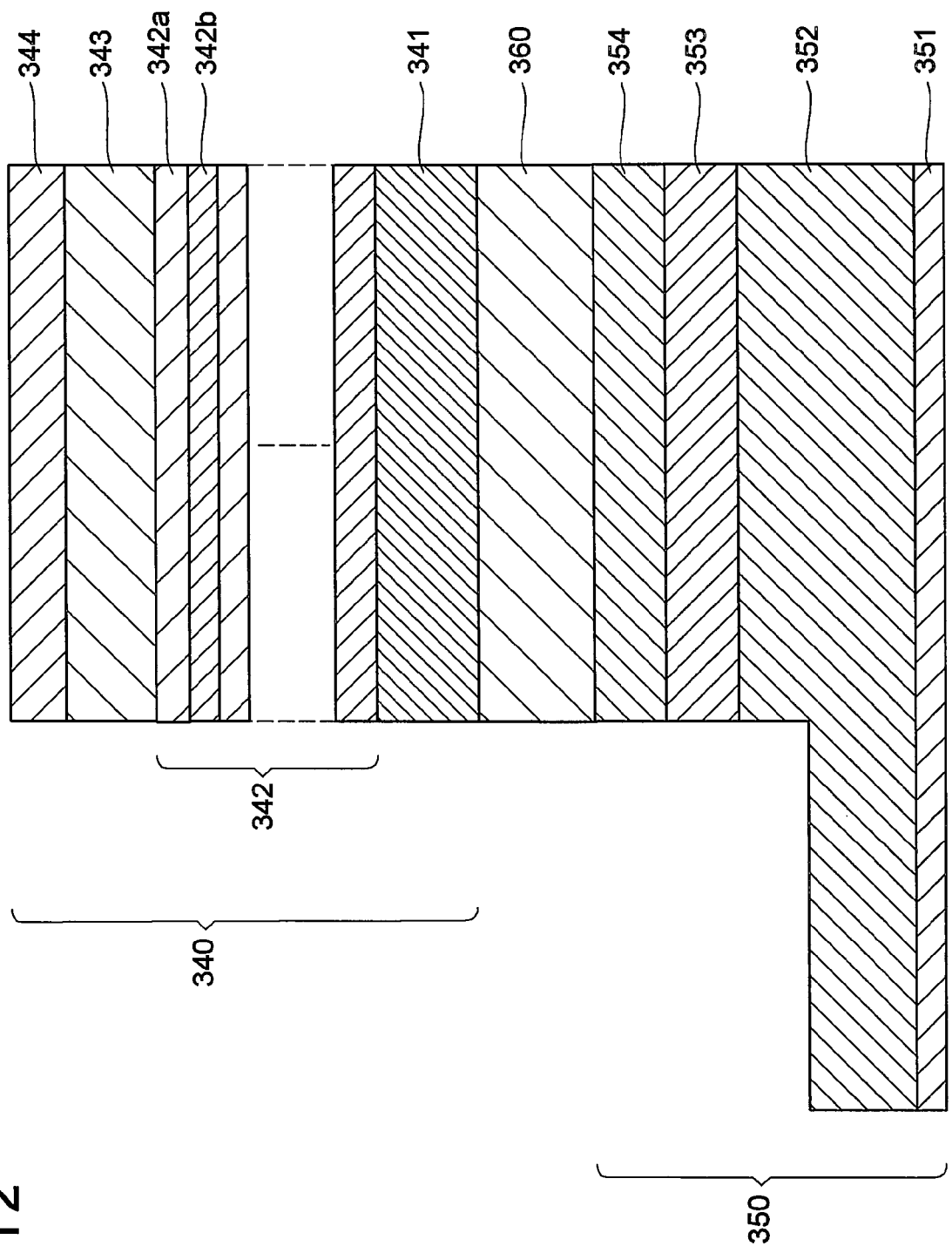
FIG. 12 is a sectional view showing GaN-based single-crystal thin-film semiconductor light-emitting elements according to Example 2-3 of the second embodiment of the present invention.

A display device of Example 2-3 of the second embodiment includes GaN-based single-crystal thin-film semiconductor light-emitting elements. FIG. 12 is a sectional view showing GaN-based single-crystal thin-film semiconductor light-emitting elements 340 and 350 of the display device according to Example 2-3 of the second embodiment.

The upper single-crystal thin-film semiconductor light-emitting element 340 is formed on an In$_{x3}$Ga$_{1-x3}$N layer (i.e., a light absorbing layer) 360 as a non-light-transmitting layer.

The upper single-crystal thin-film semiconductor light-emitting element 340 includes a p-GaN layer 341, an active layer 342 (including a non-dope In$_{x1}$Ga$_{1-x1}$N layer 342a and a non-dope GaN layer 342b formed thereon), an n-Al$_{y1}$Ga$_{1-y1}$N layer 343 and an n-GaN layer 344 laminated in this order from the bottom (i.e., from the In$_{x3}$Ga$_{1-x3}$N layer 360 side). The lower single-crystal thin-film semiconductor light-emitting element 350 below the In$_{x3}$Ga$_{1-x3}$N layer (i.e., the light absorbing layer) 360 includes a p-Al$_{y2}$Ga$_{1-y2}$N layer 354, an active layer 353 (including a non-dope In$_{x2}$Ga$_{1-x2}$N layer and a non-dope GaN layer formed thereon), an n-GaN layer 352 and an AlN layer 351 laminated in this order from the top (i.e., from the In$_{x3}$Ga$_{1-x3}$N layer 360 side). Compositions (x1, x2 and x3) of the layers preferably satisfy a relationship, for example, x3>x1, x2.

In this regard, the light absorbing layers (i.e., the non-light-transmitting layers) of Examples 2-2 and 2-3 can be replaced with reflection layers having laminated structures of AlGaAs-based or AlGaInP-based semiconductor layers such as AlAs/Al$_x$Ga$_{1-x}$As (x≥0) or GaN-based semiconductor layers such as AlN/Al$_x$Ga$_{1-x}$N (x≥0).

Example 2-4

Figure 13:
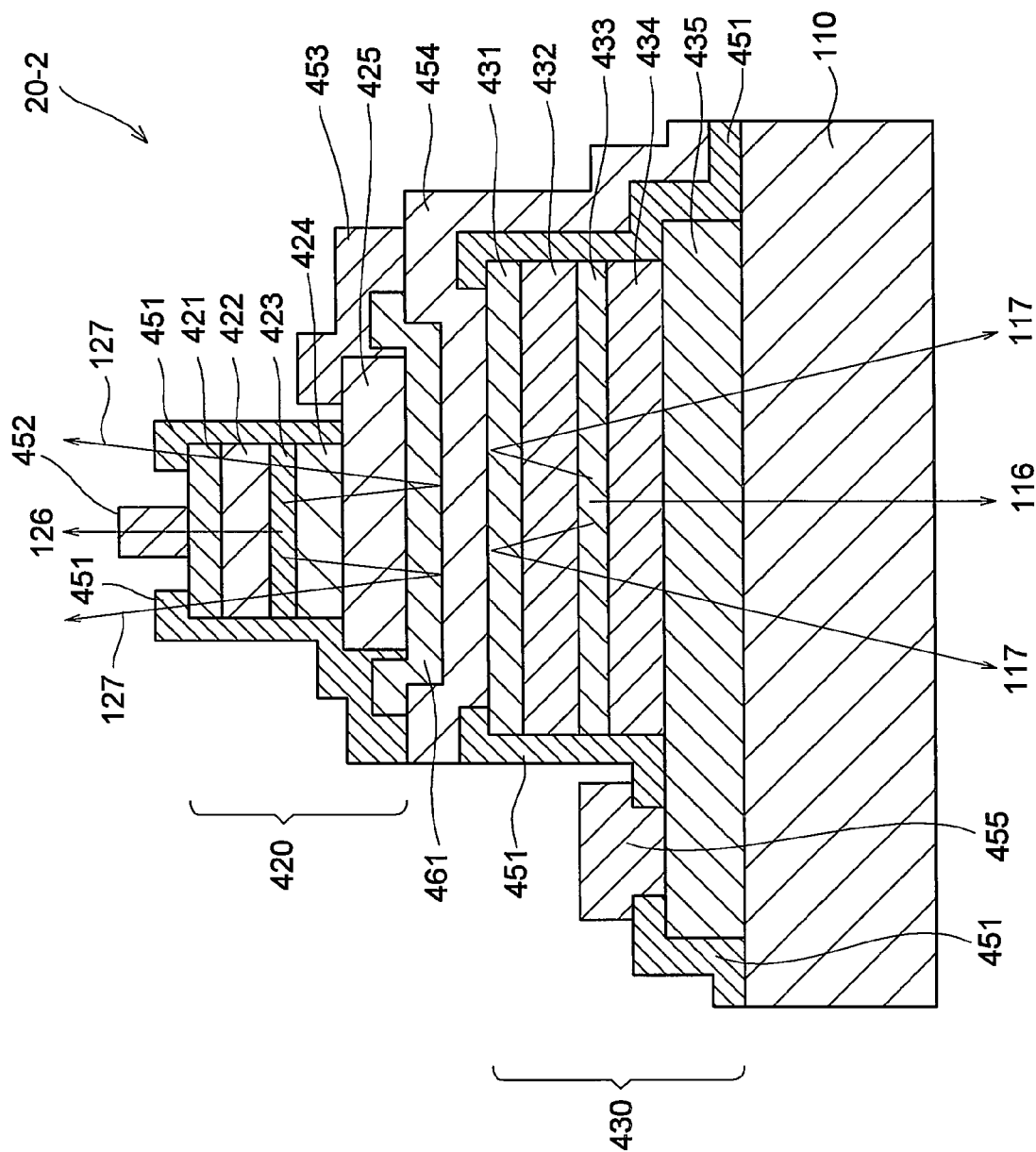
FIG. 13 is a plan view showing single-crystal thin-film semiconductor light-emitting elements according to Example 2-4 of the second embodiment of the present invention.

A display device 20-2 of Example 2-4 of the second embodiment includes AlGaAs-based single-crystal thin-film semiconductor light-emitting elements, and a metal layer (i.e., a reflection layer) as a non-light-emitting layer provided therebetween. FIG. 13 is a sectional view showing the display device 20-2 according to Example 2-4 of the second embodiment.

The display device 20-2 includes AlGaAs-based single-crystal thin-film semiconductor light-emitting elements 420 and 430 disposed on upper and lower sides of a metal layer 454 (i.e., a reflection layer or a common electrode) as a non-light-transmitting layer. The upper single-crystal thin-film semiconductor light-emitting element 420 includes a p-GaAs layer 425, a p-Al$_{z1}$Ga$_{1-z1}$As layer 424, an n-Al$_{y1}$Ga$_{1-y1}$As layer (an active layer) 423, an n-Al$_{x1}$Ga$_{1-x1}$As layer 422 and an n-GaAs layer 421 laminated in this order from the bottom (i.e., from the metal layer 454 side). The lower single-crystal thin-film semiconductor light-emitting element 430 below the metal layer 454 (i.e., the reflection layer or the common electrode) includes a p-GaAs layer 431, a p-Al$_{x2}$Ga$_{1-x2}$As layer 432, an n-Al$_{y2}$Ga$_{1-y2}$As layer (i.e., an active layer) 433, an n-Al$_{z2}$Ga$_{1-z2}$As layer 434 and an n-type conductive layer 435 (n-GaAs/n-Al$_r$Ga$_{1-r}$As/n-GaAs) laminated in this order from the top (i.e., from the metal layer 454 side).

In this example, the metal layer 454 (i.e., the reflection layer or the common electrode) also functions as a common electrode (i.e., the common electrode 252 described in Example 2-1). Therefore, the metal layer 454 needs to be formed of metal which allows low-resistance ohmic-contact with single-crystal thin-film semiconductor materials of the upper and lower single-crystal thin-film semiconductor light-emitting elements 420 and 430. For example, if the single-crystal thin-film semiconductor light-emitting elements are formed of AlGaAs-based or AlGaInP-based semiconductor materials, the metal layer 454 is formed of a laminated structure of Ti/Pt/Au/Ti or the like that allows low-resistance ohmic-contact with the GaAs layer. If the single-crystal thin-film semiconductor light-emitting elements are formed of GaN-based semiconductor materials, the metal layer 454 is formed of a laminated structure of, for example, Ni/Au/Ti or the like. The topmost Ti layer of the metal layer 454 is provided for enhancing adhesion to a dielectric layer 461. The dielectric layer 461 is provided on the metal layer 454 for bonding the metal layer 454 and the single-crystal thin-film semiconductor light-emitting element 420 to each other. In this example, the upper single-crystal thin-film semiconductor light-emitting element 420 is directly bonded onto the dielectric layer 461 by means of intermolecular force. Although it is preferable that the upper single-crystal thin-film semiconductor light-emitting element 420 is directly bonded onto the dielectric layer 461, the upper single-crystal thin-film semiconductor light-emitting element 420 can also be bonded onto the dielectric layer 461 using low-melting-point soldering, transparent conductive paste or adhesive agent or the like.

The metal layer 454 (as the common electrode), an upper n-side electrode 452, a p-side electrode 453 and a lower n-side electrode 455 are provided via an insulation film 451 as an interlayer insulation film.

In this example, the lights emitted by the light-emitting layers (the active layers) 423 and 433 of the respective single-crystal thin-film semiconductor light-emitting elements 420 and 430 are reflected by the metal layer 454 (i.e., the reflection layer and the common electrode), and emitted outside from both sides of the transparent substrate 110 as emitted lights 116, 117, 126 and 127.

In the above description, the reflection layer (as the non-light-transmitting layer) has been described as the metal layer. However, the reflection layer can be composed of a laminated structure of dielectric thin-films having largely different refractive indexes. For example, it is possible to use a laminated structure such as $ZrO_2/SiO_2$, $MgO/SiO_2$ or the like, or a laminated structure including layers of material with high refractive index and material with low refractive index. The material with high refractive index is, for example, $HfO_2$, $Sc_2O_3$, $Y_2O_3$, ThO, MgO, $Al_2O_3$ or the like. The material with low refractive index is, for example, $NdF_3$, $LaF_3$, $ThF_4$, $SiO_2$, $MgF_2$, LiF, NaF or the like. The reflection layer having the laminated structure can be provided between the dielectric layer 461 and the metal layer 454, and also can be used instead of the dielectric layer 461.

Third Embodiment

Figure 14:
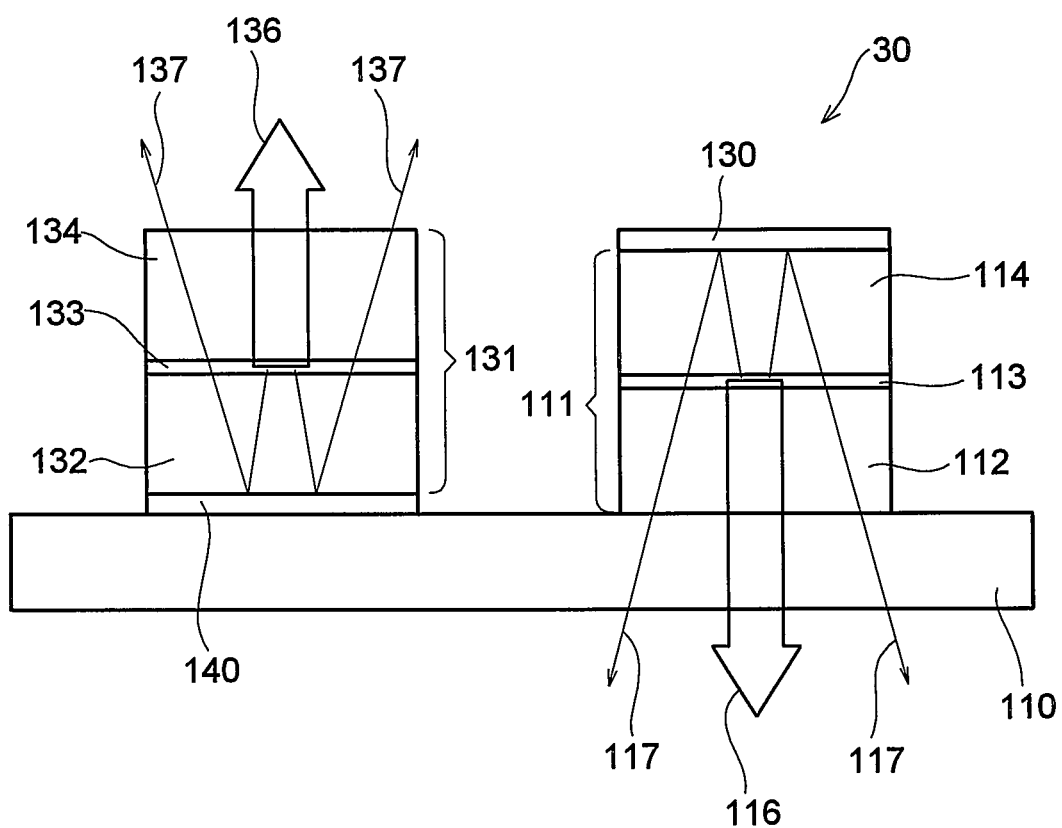
FIG. 14 is a sectional view showing a display device including single-crystal thin-film semiconductor light-emitting elements according to the third embodiment of the present invention.

FIG. 14 is a sectional view showing a display device 30 according to the third embodiment of the present invention. As shown in FIG. 14, in the display device 30, first and second single-crystal thin-film semiconductor light-emitting elements 111 and 131 are disposed on one side of the transparent substrate 110 so as to be adjacent to each other. Further, a first non-light-transmitting layer 130 is disposed on a top of the first single-crystal thin-film semiconductor light-emitting element 111. A second non-light-transmitting layer 140 is disposed between the second single-crystal thin-film semiconductor light-emitting element 131 and the transparent substrate 110. The first single-crystal thin-film semiconductor light-emitting element 111 has the same structure as the single-crystal thin-film semiconductor light-emitting element 111 (FIG. 2) of the first embodiment. The second single-crystal thin-film semiconductor light-emitting element 131 includes a light-emitting layer (an active layer) 133 and non-light-emitting layers 132 and 134 disposed on both sides of the light-emitting layer 133. Each of the non-light-emitting layers 132 and 134 has a higher energy band gap than the light-emitting layer 133. Each of the single-crystal thin-film semiconductor light-emitting elements 111 and 131 preferably has a thickness in a range from 2 μm to 3 μm. The non-light-transmitting layers 130 and 140 reflect or absorb the lights emitted by the light-emitting layers (i.e., the active layer) 113 and 133. Therefore, the lights 116 and 117 from the light-emitting layer 113 are emitted outside from a side opposite to the first non-light-transmitting layer 130 side, and the lights 136 and 137 from the light-emitting layer 133 are emitted outside from a side opposite to the second non-light-transmitting layer 140.

A plurality of pairs of the single-crystal thin-film semiconductor light-emitting elements 111 and 131 are arranged one-dimensionally or two-dimensionally. Further, the display device 30 has a drive control circuit 190 (see FIG. 15) that independently controls light emissions of the single-crystal thin-film semiconductor light-emitting elements 111 and 131 on the transparent substrate 110.

With such a configuration, the display device 30 is able to independently display images on both sides of the transparent substrate 110. Further, sizes and arrangements of pixels can be different between both sides of the transparent substrate 110.

Examples of Third Embodiment

Next, structures and operations of examples and modifications of the third embodiment will be described with reference to FIGS. 15 through 18.

Example 3-1

Figure 15:
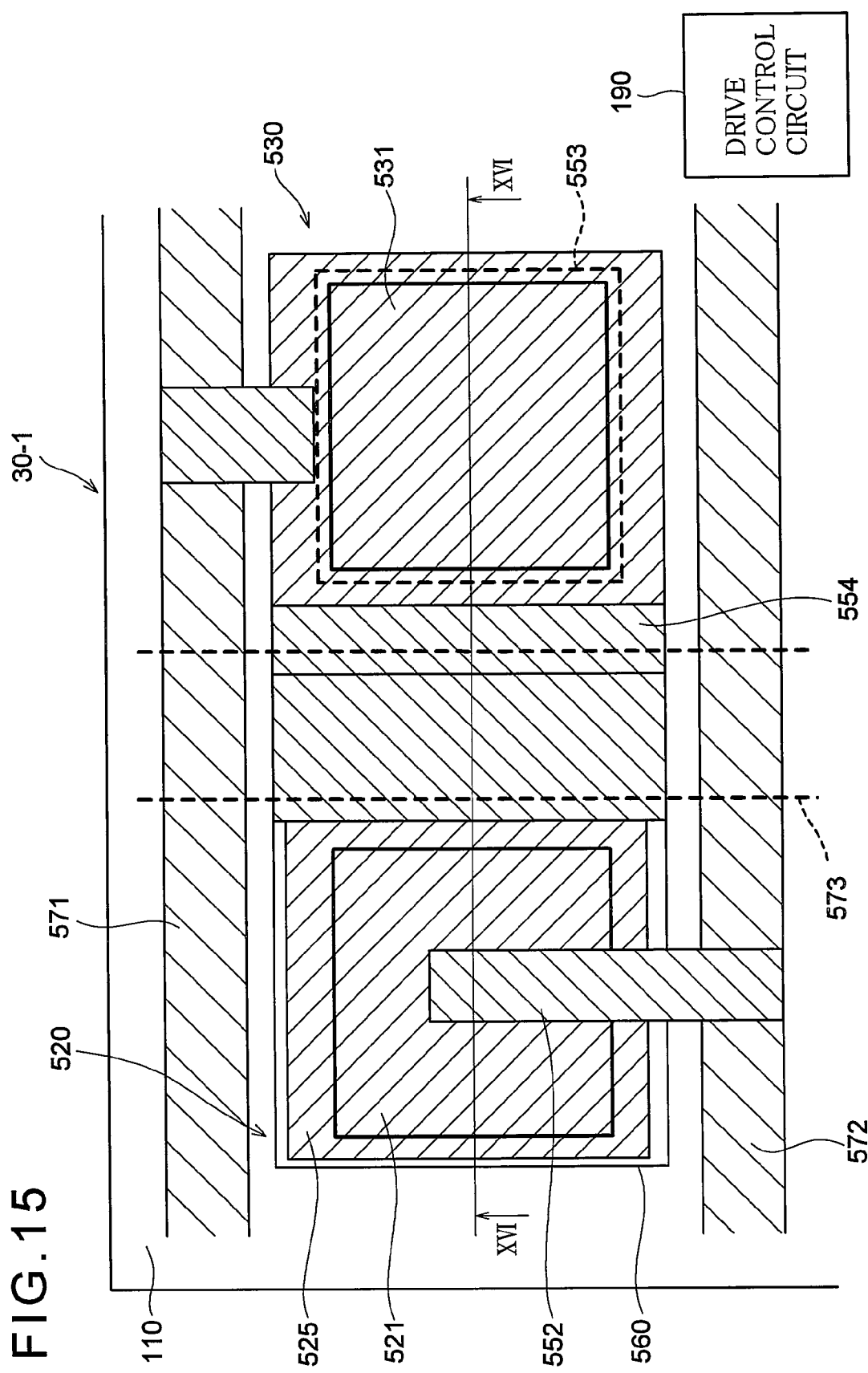
FIG. 15 is a plan view showing a structure and operation of the display device according to the third embodiment of the present invention.
Figure 16:
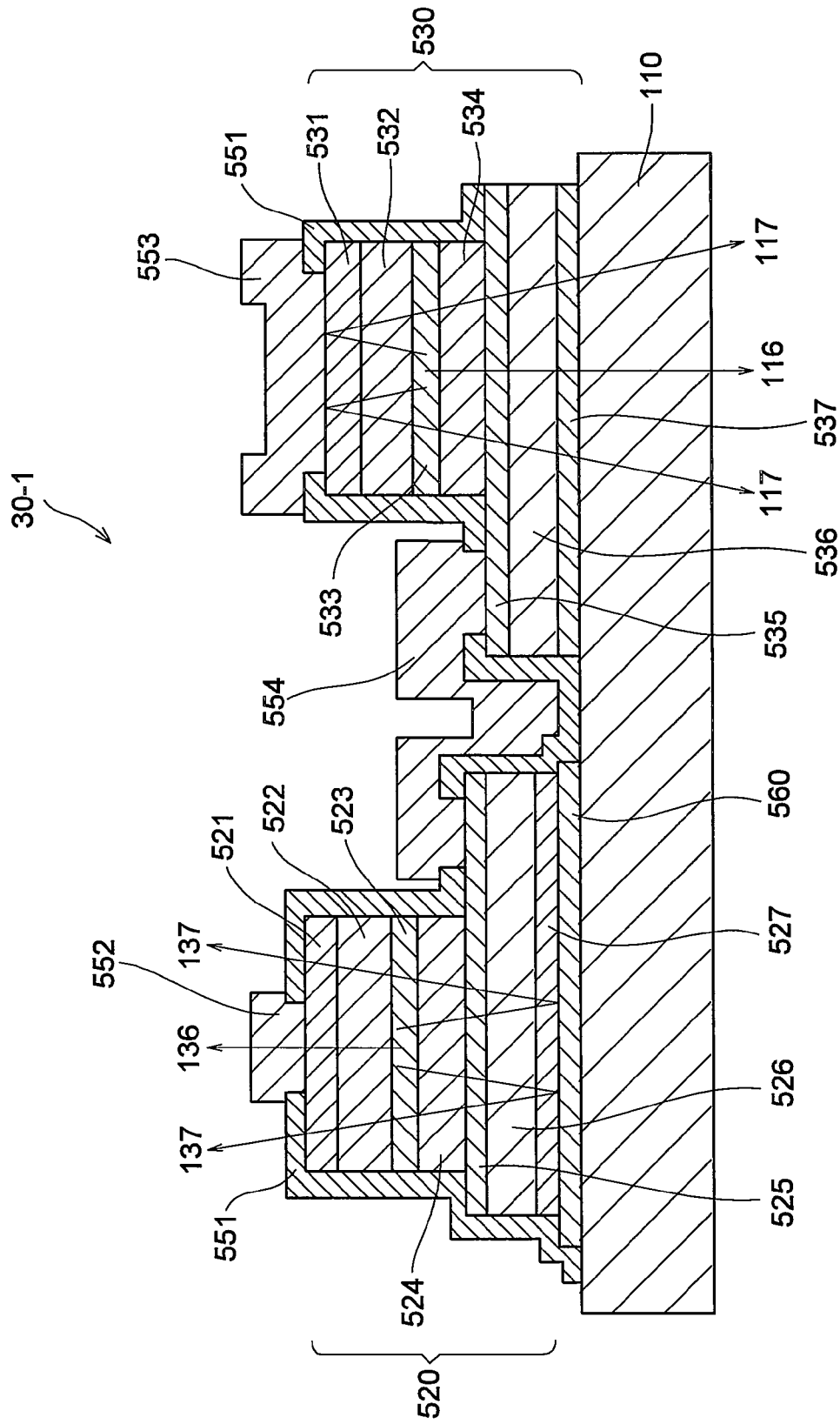
FIG. 16 is a plan view showing a display device including single-crystal thin-film semiconductor light-emitting elements according to Example 3-1 of the third embodiment of the present invention.

A display device 30-1 of Example 3-1 of the third embodiment includes AlGaAs-based single-crystal thin-film semiconductor light-emitting elements 520 and 530 as light sources. FIG. 15 is a sectional view showing the display device 30-1 according to Example 3-1 of the third embodiment, including the AlGaAs-based single-crystal thin-film semiconductor light-emitting elements 520 and 530. FIG. 16 is a sectional view taken along Line XVI-XVI in FIG. 15.

In the display device 30-1, a plurality of pairs of the AlGaAs-based single-crystal thin-film semiconductor light-emitting elements 520 and 530 are arranged two-dimensionally on the transparent substrate 110. The AlGaAs-based single-crystal thin-film semiconductor light-emitting elements 520 and 530 (on the left and right in FIG. 15) have common electrodes 554 connected to common wirings 573, and have metal wirings (the reflection layers) 553 and electrodes 552 respectively connected to control wirings 571 and 572. The drive control circuit 190 independently controls the single-crystal thin-film semiconductor light-emitting elements 520 and 530 (on the left and right in FIG. 15).

As shown in FIG. 16, the single-crystal thin-film semiconductor light-emitting element 530 (on the right in FIG. 16) is formed on the transparent substrate 110 and below the metal layer 553 (the reflection layer) as the first non-light-transmitting layer. The single-crystal thin-film semiconductor light-emitting element 530 includes a GaAs layer 531, an $Al_{z1}Ga_{1-z1}As$ layer 532, an $Al_{y1}Ga_{1-y1}As$ layer (i.e., an active layer) 533, an $Al_{x1}Ga_{1-x1}As$ layer 534, a GaAs layer 535, an $Al_{r1}Ga_{1-r1}As$ layer 536 and a GaAs layer 537 laminated in this order from the top (i.e., the metal layer 553 side). The single-crystal thin-film semiconductor light-emitting element 520 (on the left in FIG. 16) is formed on the metal layer (the reflection layer) 560 as the second non-light-transmitting layer on the transparent substrate 110. The single-crystal thin-film semiconductor light-emitting element 520 includes a GaAs layer 527, an $Al_{r2}Ga_{1-r2}As$ layer 526, a GaAs layer 525, an $Al_{x2}Ga_{1-x2}As$ layer 524, an $Al_{y2}Ga_{1-y2}As$ layer 523 (i.e., an active layer), an $Al_{z2}Ga_{1-z2}As$ layer 522 and a GaAs layer 521 laminated in this order from the bottom (i.e., from the metal layer 560 side). The common electrode 554, the metal layer 553 and the electrode 552 are provided via an insulation film 551 as an interlayer insulation film. The metal layer 553 also functions as an individual electrode of the single-crystal thin-film semiconductor light-emitting element 530 (on the right in FIG. 16). The electrode 552 functions an individual electrode of the single-crystal thin-film semiconductor light-emitting element 520 (on the left in FIG. 16). The metal layer (i.e., the reflection layer) 560 is formed of, for example, Ti, Ti/AuGeNi, Ti/Pt/Au, Ti/Cu, Ti/Pt or the like, and the metal layer (i.e., the reflection layer) 553 is formed of, for example, Ti, AuGeNi/Ti, Au/Pt/Ti, Cu/Ti, Pt/Ti or the like (in this regard, "A/B" means that "A is laminated on B").

According to Example 3-1, the lights emitted by the light-emitting layers 523 and 533 of the adjacent two single-crystal thin-film semiconductor light-emitting elements 520 and 530 are respectively reflected by the metal layers (the reflection layers) 553 and 560 as non-light-transmitting layers, and emitted outside as emitted lights 116, 117, 136 and 137.

Modification 3-1

Figure 17:
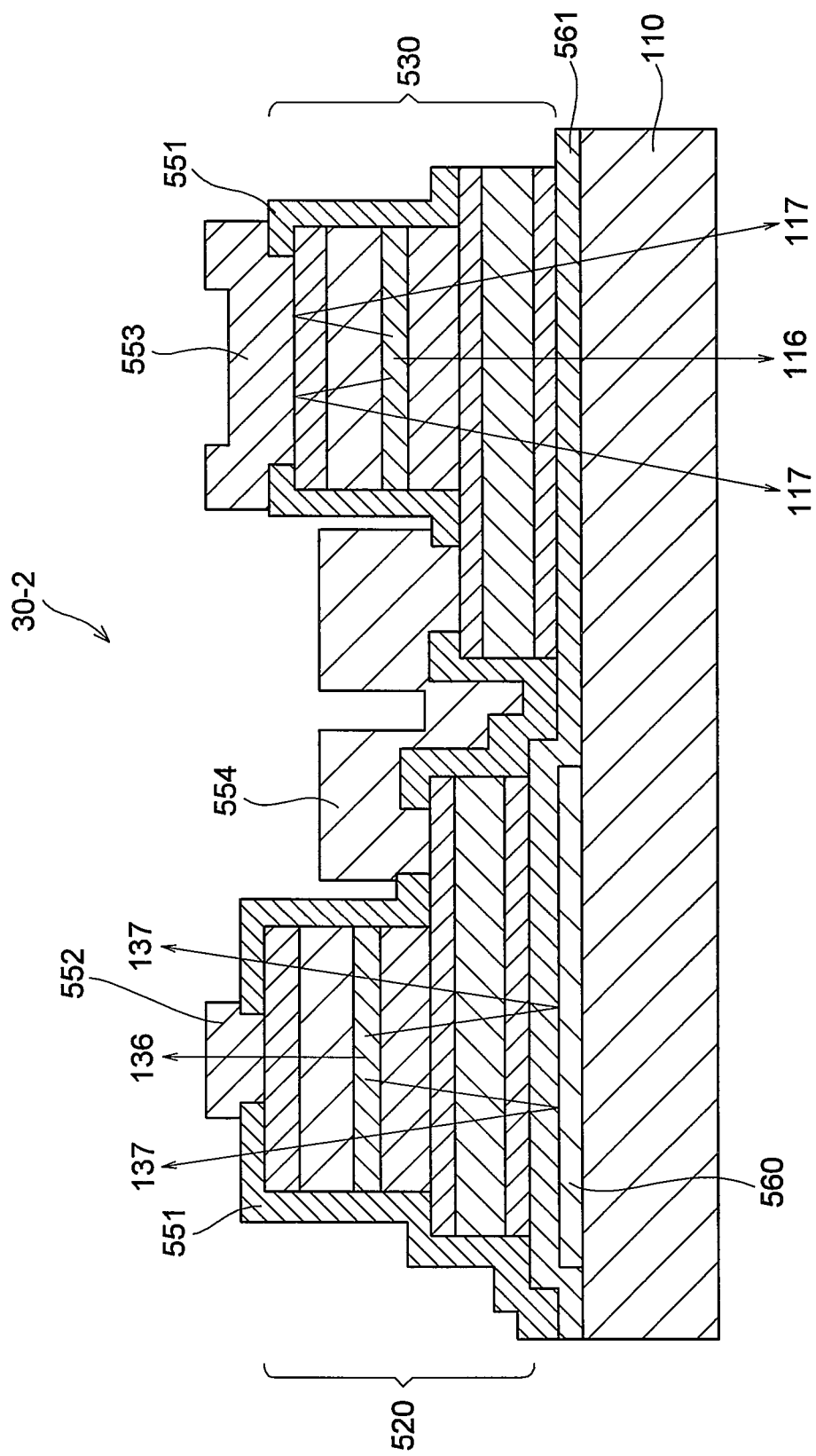
FIG. 17 is a plan view showing a display device including single-crystal thin-film semiconductor light-emitting elements according to Modification 3-1 of the third embodiment of the present invention.

In a modification of Example 3-1 (referred to as Modification 3-1), a display device 30-2 includes a dielectric layer 561 provided between the transparent substrate 110 and the single-crystal thin-film semiconductor light-emitting elements 520 and 530, as shown in FIG. 17. Structures of the single-crystal thin-film semiconductor light-emitting elements 520 and 530, electrodes or the like of Modification 3-1 are the same as those of Example 3-1. The display device 30-2 of Modification 3-1 is different from the display device 30-1 of Example 3-1 in that the display device 30-2 includes the dielectric layer 561. The dielectric layer 561 can be formed of, for example, organic material layer inorganic or material layer (oxide layer or nitride layer) that transmits the lights emitted by the light-emitting layers of the single-crystal thin-film semiconductor light-emitting elements 520 and 530.

According to Modification 3-1, the lights emitted by the light-emitting layers of the adjacent two single-crystal thin-film semiconductor light-emitting elements 520 and 530 are respectively reflected by the metal layers (i.e., the reflection layers) 553 and 560 as non-light-transmitting layers, pass through the dielectric layer 561, and are emitted outside as emitted lights 116, 117, 136 and 137.

Example 3-2

Figure 18:
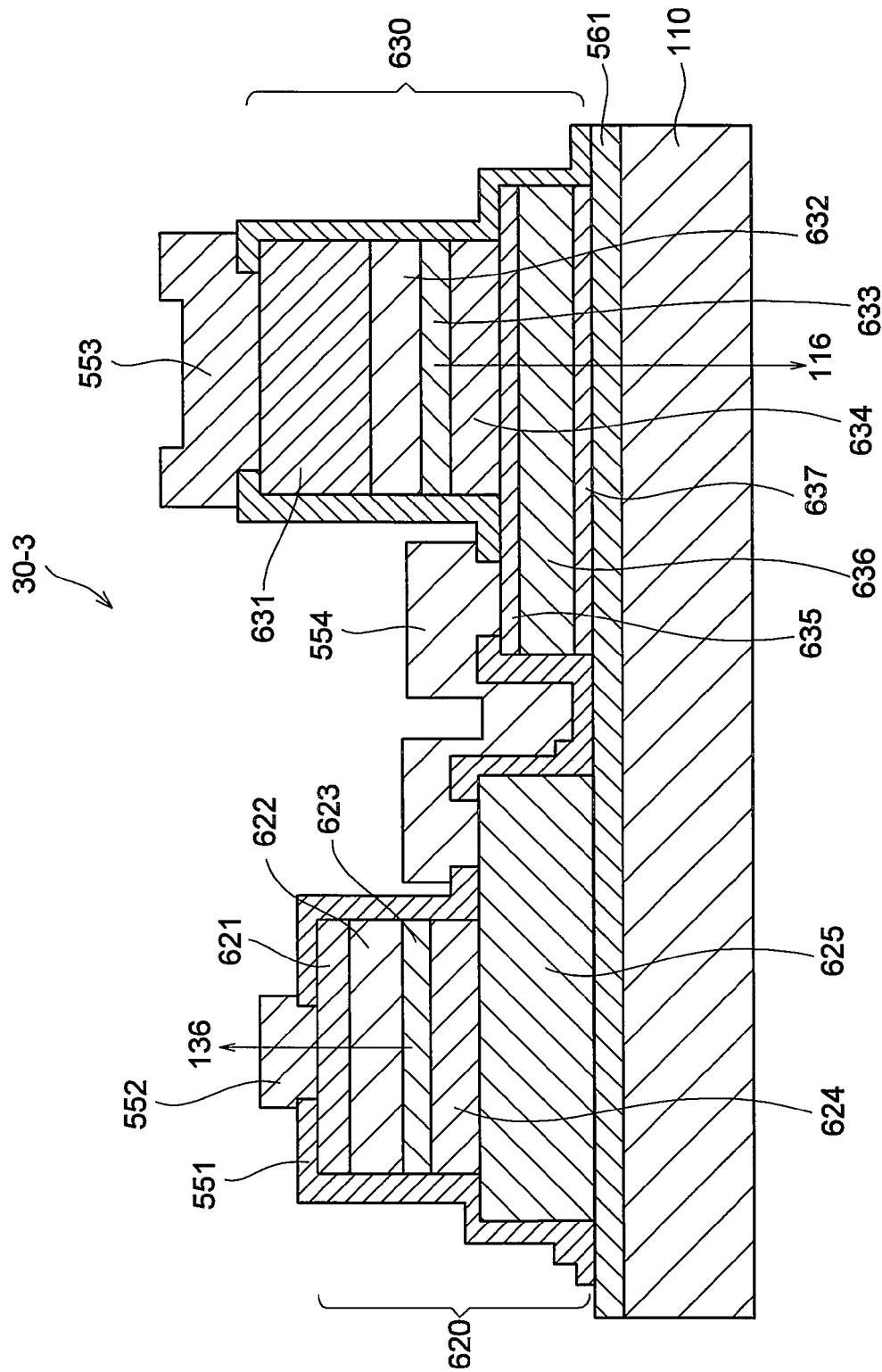
FIG. 18 is a plan view showing a display device including single-crystal thin-film semiconductor light-emitting elements according to Example 3-2 of the third embodiment of the present invention.

FIG. 18 is a sectional view showing a structure of a display device 30-3 of Example 3-2 of the third embodiment. The structure and operation of the display device 30-3 will be described with reference to FIG. 18.

In the display device 30-3, AlGaAs-based single-crystal thin-film semiconductor light-emitting elements 620 and 630 respectively have light absorbing layers 625 and 631 (as first and second non-light-transmitting layers) that absorb lights emitted by the light-emitting layers of the single-crystal thin-film semiconductor light-emitting elements 620 and 630. A plurality of pairs of the AlGaAs-based single-crystal thin-film semiconductor light-emitting elements 620 and 630 (on the left and right in FIG. 18) are arranged two-dimensionally on the dielectric layer 561 on the transparent substrate 110. The respective AlGaAs-based single-crystal thin-film semiconductor light-emitting elements 620 and 630 are connected to common electrodes 554 and respectively have individual electrodes (i.e., the metal layer 553 and the electrode 552) as described in Example 3-1.

More specifically, in the display device 30-3, the single-crystal thin-film semiconductor light-emitting element 630 on the right in FIG. 18 is formed on the dielectric layer 561 and below the metal layer 553. The single-crystal thin-film semiconductor light-emitting element 630 includes a GaAs layer (i.e., the light absorbing layer) 631, an $Al_{z1}Ga_{1-z1}As$ layer 632, an $Al_{y1}Ga_{1-y1}As$ layer (an active layer) 633, an $Al_{x1}Ga_{1-x1}As$ layer 634, a GaAs layer 635, an $Al_{t1}Ga_{1-t1}As$ layer 636 and a GaAs layer 637 laminated in this order from the top (i.e., the metal layer 553 side). The single-crystal thin-film semiconductor light-emitting element 620 on the left in FIG. 18 is formed on the dielectric layer 561 on the transparent substrate 110. The single-crystal thin-film semiconductor light-emitting element 620 includes a GaAs layer (i.e., the light absorbing layer) 625, an $Al_{x2}Ga_{1-x2}As$ layer 624, an $Al_{y2}Ga_{1-y2}As$ layer (an active layer) 623, an $Al_{z2}Ga_{1-z2}As$ layer 622 and a GaAs layer 621 laminated in this order from the bottom (i.e., on the dielectric layer 561 side). As described in Example 3-2, the common electrode 554, the metal layer 553 and the electrode 552 are provided on the single-crystal thin-film semiconductor light emitting elements 620 and 630 via the insulation film 551 as an interlayer insulation film. The metal layer 553 also functions as an individual electrode of the single-crystal thin-film semiconductor light-emitting element 630 (on the right in FIG. 18). The electrode 552 functions an individual electrode of the single-crystal thin-film semiconductor light-emitting element 620 (on the left in FIG. 18).

According to Example 3-2, the lights emitted by the light-emitting layers (i.e., the active layers) 623 and 633 of the adjacent two single-crystal thin-film semiconductor light-emitting elements 620 and 630 toward the GaAs layers (i.e., the light absorbing layers) 625 and 631 are absorbed by the GaAs layers 625 and 631, and the lights emitted by the light-emitting layers 623 and 633 away from the GaAs layers 625 and 631 are emitted outside as emitted lights 116 and 136.

In the third embodiment (and examples and modification thereof), the display devices using AlGaAs-based single-crystal thin-film semiconductor light-emitting elements have been described. However, the single-crystal thin-film semiconductor light-emitting elements are not limited to the AlGaAs-based single-crystal thin-film semiconductor light-emitting elements, but AlGaInP-based or GaN-based single-crystal thin-film semiconductor light-emitting elements can also be used.

In the above described embodiments, examples and modifications, the light-emitting elements have been described as light-emitting diodes (LEDs). However, the present invention is not limited to LEDs, but also applicable to, for example, laser diodes (LDs). In particular, it is advantageous to apply the present invention to surface-emission type laser diodes or the like. In such a case, for example, uncooled laser diodes are expected to be accomplished.

Further, in the above described embodiments, examples and modifications, the light-emitting elements used in the display device have been described. However, the present invention is also applicable to, for example, a thin double-sided display/sensor device having both functions of double-sided display and double-sided sensor and using single-crystal thin-film semiconductor light-emitting element and single-crystal thin-film semiconductor light receiving element.

Furthermore, the present invention is applicable to applications in which the single-crystal thin-film semiconductor light-emitting element is used in a state where the base substrate (i.e., which is not an effective operation region of a device) is separated therefrom. For example, the present invention is applicable to high-power high-frequency semiconductor electronic devices such as nitride-semiconductor high electron mobility transistors (HEMT).

According to an aspect of the present invention, there is provided a display device including a transparent substrate, and a plurality of single-crystal thin-film semiconductor light-emitting elements disposed on one side of the transparent substrate. Each of the single-crystal thin-film semiconductor light-emitting elements is composed of single-crystal thin-film semiconductor layers separated from a base substrate, and includes a light-emitting layer (for example, an active layer) and two non-light-emitting layers disposed on both sides of the light-emitting layer. The non-light-emitting layer preferably has a higher energy band gap than the light-emitting layer.

With such a configuration, the base substrate (for forming the single-crystal thin-film layers) does not exist in the display device, and therefore lights emitted the light-emitting layer are emitted outside.

Further, it is preferable to display images on both sides of the transparent substrate using light emitted from first sides of the single-crystal thin-film semiconductor light-emitting elements, and using light emitted from second sides of the single-crystal thin-film semiconductor light-emitting elements and passing through the transparent substrate.

Furthermore, it is preferable to arrange a plurality of single-crystal thin-film semiconductor light-emitting elements one-dimensionally or two-dimensionally.

With such a configuration, images can be displayed on both sides of the transparent substrate using the lights emitted from the light-emitting layer.

Moreover, it is preferable that a drive control circuit reverses a scanning direction (along which light emission signals are sent to the single-crystal thin-film semiconductor light-emitting elements) at constant time intervals.

With such a configuration, the same images can be alternately displayed on both side of the transparent substrate for constant time periods.

Further, it is preferable to dispose a first single-crystal thin-film semiconductor light-emitting element on the transparent substrate, and a second single-crystal thin-film semiconductor light-emitting element on the first single-crystal thin-film semiconductor light-emitting element via a non-light-transmission layer. The first and second single-crystal thin-film semiconductor light-emitting elements are respectively composed of different single-crystal thin-film semiconductor layers with different light-emitting layers.

In particular, the non-light-transmission layer can be configured to reflect or absorb lights emitted by the light-emitting layers of the first and second single-crystal thin-film semiconductor light-emitting elements.

It is advantageous to provide a drive control circuit that independently controls light emissions of the first and second single-crystal thin-film semiconductor light-emitting elements on both sides of the non-light-transmission layer.

With such a configuration, images can be independently displayed on both side of the transparent substrate.

Moreover, it is preferable to provide first and second single-crystal thin-film semiconductor light-emitting elements on the transparent substrate so as to be adjacent to each other. A first non-light-transmission layer may be formed on a top of the first single-crystal thin-film semiconductor light-emitting element, and a second non-light-transmission layer may be formed between the second single-crystal thin-film semiconductor light-emitting element and the transparent substrate.

The first and second non-light-transmission layers preferably reflect or absorb lights emitted by the first and second single-crystal thin-film semiconductor light-emitting elements.

Additionally, a combination of the first and second single-crystal thin-film semiconductor light-emitting elements may be arranged one-dimensionally or two-dimensionally.

Further, it is advantageous to provide a drive control circuit that independently controls light emissions of the first and second single-crystal thin-film semiconductor light-emitting elements adjacent to each other on the transparent substrate.

With such a configuration, images can be independently displayed on both sides of the transparent substrate. Moreover, pixels as seen from both sides of the transparent substrate can have different sizes and arrangement pitches. For example, pixels as seen from both sides of the transparent substrate can have different sizes when the semiconductor light-emitting elements laminated via the non-light-transmission layer (as in FIGS. 10 and 13) have different surface areas, or when the semiconductor light-emitting elements disposed adjacent to each other so as to emit lights in directions opposite to each other (as in FIGS. 16-18) have different surface areas. Further, pixels as seen from both sides of the transparent substrate can have different arrangement pitches when the semiconductor light-emitting element(s) emitting light in one direction and the semiconductor light-emitting element(s) emitting light in opposite direction are different in number per unit area.

While the preferred embodiments of the present invention have been illustrated in detail, it should be apparent that modifications and improvements may be made to the invention without departing from the spirit and scope of the invention as described in the following claims.

What is claimed is:

1. A double-sided display device comprising:
a transparent substrate having an upper surface and a lower surface opposite to each other;
a first light-emitting element disposed above the upper surface of the transparent substrate and directly contacting the upper surface of the transparent substrate, the first light-emitting element being composed of single-crystal thin-film semiconductor layers including a first light-emitting layer and two non-light-emitting layers disposed on two opposite sides of the first light-emitting layer;
a second light-emitting element disposed above the upper surface of the transparent substrate, the second light-emitting element being composed of single-crystal thin-film semiconductor layers including a second light-emitting layer and two non-light-emitting layers disposed on two opposite sides of the second light-emitting layer;
a first non-light-transmission layer disposed above the first light-emitting element; and
a second non-light-transmission layer disposed between the second light-emitting element and the upper surface of the transparent substrate.

2. The double-sided display device according to claim 1, wherein the first light-emitting element and the second light-emitting element are disposed adjacent to each other.

3. The double-sided display device according to claim 1, wherein the first non-light-transmission layer and the second non-light-transmission layer reflect or absorb lights respectively emitted by the first and second light-emitting elements.

4. The double-sided display device according to claim 1, wherein the first light-emitting element is a plurality of first light-emitting elements, and the second light-emitting element includes a plurality second light-emitting elements, and a plurality of pairs of the first and second light-emitting elements are arranged one-dimensionally or two-dimensionally.

5. The double-sided display device according to claim 1, further comprising a drive control circuit that independently controls light emissions of the first and second light-emitting elements.

6. The double-sided display device according to claim 1, wherein light emitted by the first light-emitting element proceeds in a direction opposite to light emitted by the second light-emitting element.

7. The double-sided display device according to claim 1, wherein the first non-light-transmission layer is formed of a metal layer.

8. The double-sided display device according to claim 7, wherein the first non-light-transmission layer is connected to a wiring.

9. The double-sided display device according to claim 1, wherein the second non-light-transmission layer is formed of a metal layer.

10. The double-sided display device according to claim 1, wherein each of the first and second non-light-transmission layers is formed of a semiconductor layer.

11. The double-sided display device according to claim 1, further comprising a dielectric layer disposed on the transparent substrate.

12. The double-sided display device according to claim 1, wherein the second non-light-transmission layer directly contacts the upper surface of the transparent substrate, and the second light-emitting element directly contacts the second non-light-transmission layer.

13. The double-sided display device according to claim 1, wherein the first non-light-transmission layer is disposed above both of the first and second light-emitting layers.

14. The double-sided display device according to claim 1, wherein the first non-light-transmission layer is disposed above all of both of the first and second light-emitting elements.

15. The double-sided display device according to claim 1, further comprising a common electrode directly connected with each of the first and second light-emitting elements, wherein the first non-light-transmission layer operates as an individual electrode for the first light emitting element.

16. The double-sided display device according to claim 1, wherein the first light-emitting element is a plurality of first light-emitting elements, and the second light-emitting element includes a plurality second light-emitting elements, a plurality of pairs of the first and second light-emitting elements are arranged in columns and rows.

17. The double-sided display device according to claim 1, wherein the first non-light-transmission layer reflects or absorbs all of the light emitted by the first light-emitting element, and the second non-light-transmission layer reflects or absorbs all of the light emitted by the second light-emitting element.

* * * * *